(12) United States Patent
Jain et al.

(10) Patent No.: US 9,229,319 B2
(45) Date of Patent: Jan. 5, 2016

(54) PHOTOACID-GENERATING COPOLYMER AND ASSOCIATED PHOTORESIST COMPOSITION, COATED SUBSTRATE, AND METHOD OF FORMING AN ELECTRONIC DEVICE

(71) Applicant: ROHM AND HAAS ELECTRONIC MATERIALS LLC, Marlborough, MA (US)

(72) Inventors: Vipul Jain, North Grafton, MA (US); Owendi Ongayi, Marlborough, MA (US); James W. Thackeray, Braintree, MA (US); James F. Cameron, Brookline, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/527,961

(22) Filed: Oct. 30, 2014

(65) Prior Publication Data
US 2015/0177613 A1 Jun. 25, 2015

Related U.S. Application Data

(60) Provisional application No. 61/918,163, filed on Dec. 19, 2013.

(51) Int. Cl.
| | | |
|---|---|---|
| G03F 7/039 | (2006.01) | |
| C08F 220/22 | (2006.01) | |
| C08F 220/30 | (2006.01) | |
| G03F 7/20 | (2006.01) | |
| G03F 7/004 | (2006.01) | |
| C08F 220/28 | (2006.01) | |

(52) U.S. Cl.
CPC .............. G03F 7/004 (2013.01); C08F 220/28 (2013.01); G03F 7/2004 (2013.01)

(58) Field of Classification Search
CPC ........ C08F 22/10; C08F 22/14; C08F 220/30; C08F 220/18; C08F 220/20; C08F 220/24; C08F 220/28; C08F 220/38; G03F 7/0045; G03F 7/039; G03F 7/0392; G03F 7/0397; G03F 7/20
See application file for complete search history.

(56) References Cited

U.S. PATENT DOCUMENTS

| | | | |
|---|---|---|---|
| 2,760,863 A | 8/1956 | Plambeck, Jr. | |
| 2,850,445 A | 9/1958 | Oster | |
| 2,875,047 A | 2/1959 | Oster | |
| 3,097,096 A | 7/1963 | Oster | |
| 3,427,161 A | 2/1969 | Laridon et al. | |
| 3,479,185 A | 11/1969 | Chambers, Jr. | |
| 3,549,367 A | 12/1970 | Chang et al. | |
| 4,189,323 A | 2/1980 | Buhr | |
| 4,343,885 A | 8/1982 | Reardon, Jr. | |
| 4,442,197 A | 4/1984 | Crivello et al. | |
| 4,603,101 A | 7/1986 | Crivello | |
| 4,624,912 A | 11/1986 | Zweifel et al. | |
| 5,128,232 A | 7/1992 | Thackeray et al. | |
| 5,344,742 A | 9/1994 | Sinta et al. | |
| 8,288,076 B2 | 10/2012 | Masunaga et al. | |
| 8,329,379 B2 | 12/2012 | Ito et al. | |
| 8,431,325 B2 | 4/2013 | Hashimoto et al. | |
| 8,440,385 B2 | 5/2013 | Hirano et al. | |
| 8,450,042 B2 | 5/2013 | Hatakeyama et al. | |
| 8,501,384 B2 | 8/2013 | Hatakeyama et al. | |
| 8,507,174 B2 | 8/2013 | Takahashi et al. | |
| 2006/0147836 A1 | 7/2006 | Hatakeyama et al. | |
| 2007/0172761 A1 | 7/2007 | Takahashi et al. | |
| 2009/0317741 A1 | 12/2009 | Iwai et al. | |
| 2011/0159429 A1* | 6/2011 | Thackeray et al. ........ 430/270.1 |
| 2011/0183263 A1 | 7/2011 | Takahashi et al. | |
| 2012/0076997 A1 | 3/2012 | Hirano et al. | |
| 2012/0082939 A1 | 4/2012 | Kawabata et al. | |
| 2012/0129105 A1* | 5/2012 | Thackeray et al. ........ 430/285.1 |
| 2012/0141939 A1 | 6/2012 | Thackeray et al. | |
| 2012/0156618 A1 | 6/2012 | Takahashi et al. | |
| 2012/0171616 A1 | 7/2012 | Thackeray et al. | |
| 2013/0011783 A1 | 1/2013 | Ober et al. | |
| 2014/0080062 A1 | 3/2014 | Thackeray et al. | |
| 2015/0025278 A1 | 1/2015 | Ober et al. | |
| 2015/0177615 A1 | 6/2015 | Jain et al. | |

FOREIGN PATENT DOCUMENTS

| | | |
|---|---|---|
| EP | 0164248 A2 | 12/1985 |
| EP | 2474323 A2 | 7/2012 |
| JP | 2009080160 A | 4/2009 |

OTHER PUBLICATIONS

Onishi et al., "Acid Catalyzed Resist for KrF Excimer Laser Lithography", Journal of Photopolymer Science and Technology, 4(3), pp. 337-340 (1991).
Non-Final Office Action dated Aug. 4, 2015; U.S. Appl. No. 14/528,096; filed Oct. 30, 2014 (25 pages).

* cited by examiner

*Primary Examiner* — Anca Eoff
(74) *Attorney, Agent, or Firm* — Cantor Colburn LLP

(57) ABSTRACT

A copolymer include repeat units derived from an acid-labile monomer, an aliphatic lactone-containing monomer, a $C_{1-12}$ alkyl(meth)acrylate in which the $C_{1-12}$ alkyl group includes a specific base-soluble group, a photoacid-generating monomer that includes an aliphatic anion, and a neutral aromatic monomer having the formula

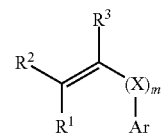

wherein $R^1$, $R^2$, $R^3$, X, m, and Ar are defined herein. The copolymer is used as a component of a photoresist composition. A coated substrate including a layer of the photoresist composition, and a method of forming an electronic device using the coated substrate are described.

11 Claims, 4 Drawing Sheets a  b  c  d

PHOTOACID-GENERATING COPOLYMER AND ASSOCIATED PHOTORESIST COMPOSITION, COATED SUBSTRATE, AND METHOD OF FORMING AN ELECTRONIC DEVICE

FIELD

The present invention relates to photoacid-generating copolymers useful as components of photoresist compositions.

INTRODUCTION

Chemical compounds that decompose to generate acids when exposed to electron beam or extreme ultraviolet radiation, also known as photoacid generators, are the basis for chemically amplified deprotection or crosslinking of polymers in chemically amplified photoresist compositions for microelectronics fabrication. The photoacid generators are incorporated into photoresist compositions as separate compounds, or as repeat units within copolymers. Existing photoresist compositions provide a useful balance of radiation sensitivity, resolution, and line width roughness. However, there is a desire for photoresists exhibiting increased ultimate resolution, reduced mottling (top roughness), and increased depth of focus without substantially compromising radiation sensitivity and/or line width roughness.

SUMMARY

One embodiment is a copolymer comprising repeat units derived from an acid-labile monomer; an aliphatic, lactone-containing monomer; a base-soluble monomer comprising a 1,1,1,3,3,3-hexafluoro-2-hydroxyprop-2-yl substituent or a —NH—S(O)$_2$—R$^b$ substituent wherein R$^b$ is C$_{1-4}$ perfluoroalkyl; a photoacid-generating monomer comprising an aliphatic anion; and a neutral aromatic monomer having the formula

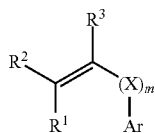

wherein R$^1$, R$^2$, and R$^3$ are each independently hydrogen, halogen, C$_{1-6}$ alkyl, or halogenated C$_{1-6}$ alkyl; m is 0 or 1; X is —O—, —C(O)—, —C(O)—O—, —S—, —S(O)—, —S(O)$_2$—, —S(O)$_2$—N(R$^4$)—, —N(R$^4$)—S(O)$_2$—, C$_{1-12}$ hydrocarbylene, —O—(C$_{1-12}$ hydrocarbylene)-, —(C$_{1-12}$ hydrocarbylene)-O—, or —C(O)—O—(C$_{1-12}$ hydrocarbylene)-, wherein R$^4$ is C$_{1-6}$ alkyl; and Ar is an unsubstituted or substituted C$_{6-24}$ aryl, wherein when Ar is a substituted C$_{6-24}$ aryl, it is substituted with one or more groups selected from the group consisting of halogen, C$_{1-12}$ hydrocarbyl, and halogenated C$_{1-12}$ hydrocarbyl; wherein the repeat units are derived from monomers comprising no more than 55 mole percent of monomers comprising an aromatic group.

Another embodiment is a photoresist composition comprising the any of the copolymers described herein.

Another embodiment is a coated substrate comprising: (a) a substrate having one or more layers to be patterned on a surface thereof; and (b) a layer of the photoresist composition of claim 9 over the one or more layers to be patterned.

Another embodiment is a method of forming an electronic device, comprising: (a) applying a layer of the photoresist composition on a substrate; (b) pattern-wise exposing the photoresist composition layer to extreme ultraviolet or electron beam activating radiation; and (c) developing the exposed photoresist composition layer to provide a resist relief image.

These and other embodiments are described in detail below.

DETAILED DESCRIPTION

Figure 1:
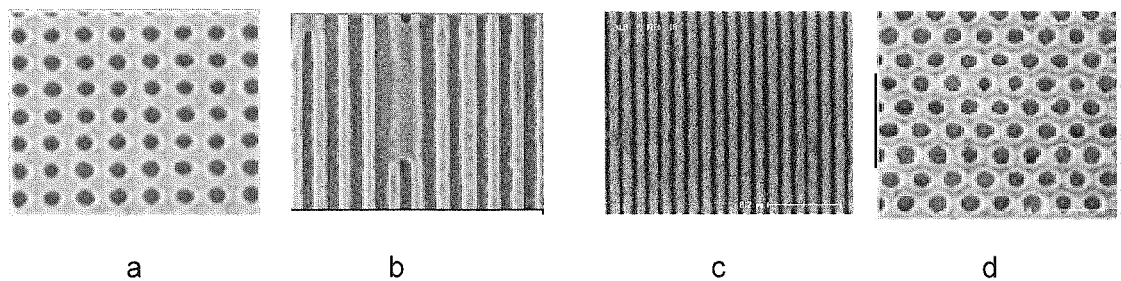
FIG. 1 shows 24 nanometer contact hole and 22 nanometer and 17 nanometer (half-pitch) line/space performance for the photoresist compositions of Comparative Examples 1 and 2, respectively.

The present inventors have determined that the copolymers described herein provide photoresist compositions with increased ultimate resolution, reduced mottling (top roughness), and increased depth of focus without substantially compromising radiation sensitivity and/or line width roughness.

One embodiment is a copolymer comprising repeat units derived from an acid-labile monomer; an aliphatic, lactone-containing monomer; a C$_{1-12}$ alkyl(meth)acrylate in which the C$_{1-12}$ alkyl group comprises a 1,1,1,3,3,3-hexafluoro-2-hydroxyprop-2-yl substituent or a —NH—S(O)$_2$—R$^b$ substituent wherein R$^b$ is C$_1$ perfluoroalkyl; a photoacid-generating monomer comprising an aliphatic anion; and a neutral aromatic monomer having the formula

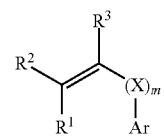

wherein R$^1$, R$^2$, and R$^3$ are each independently hydrogen, halogen, C$_{1-6}$ alkyl, or halogenated C$_{1-6}$ alkyl; m is 0 or 1; X is —O—, —C(O)—, —C(O)—O—, —S—, —S(O)—, —S(O)$_2$—, —S(O)$_2$—N(R$^4$)—, —N(R$^4$)—S(O)$_2$—, C$_{1-12}$ hydrocarbylene, —O—(C$_{1-12}$ hydrocarbylene)-, —(C$_{1-12}$ hydrocarbylene)-O—, or —C(O)—O—(C$_{1-12}$ hydrocarbylene)-, wherein R$^4$ is C$_{1-6}$ alkyl; and Ar is an unsubstituted or substituted C$_{6-24}$ aryl, wherein when Ar is a substituted C$_{6-24}$ aryl, it is substituted with one or more groups selected from the group consisting of halogen, C$_{1-12}$ hydrocarbyl, and halogenated C$_{1-12}$ hydrocarbyl.

Except as otherwise specified, "substituted" shall be understood to mean including at least one substituent such as a halogen (i.e., F, Cl, Br, I), hydroxyl, amino, thiol, carboxyl, carboxylate, ester (including acrylates, methacrylates, and lactones), amide, nitrile, sulfide, disulfide, nitro, C$_{1-18}$ alkyl, C$_{1-18}$ alkenyl (including norbornenyl), C$_{1-18}$ alkoxyl, C$_{2-18}$ alkenoxyl (including vinyl ether), C$_{6-18}$ aryl, C$_{6-18}$ aryloxyl, C$_{7-18}$ alkylaryl, or C$_{7-18}$ alkylaryloxyl. In the context of the Ar group of the neutral aliphatic monomer, "substituted" shall be understood to mean substituted with one or more groups selected from the group consisting of halogen, C$_{1-12}$ hydrocarbyl, and halogenated C$_{1-12}$ hydrocarbyl.

"Fluorinated" shall be understood to mean having one or more fluorine atoms incorporated into the group. For example, where a C$_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —CF$_3$, —C$_2$F$_5$, —C$_3$F$_7$, or —C$_4$F$_9$).

As used herein, the term "alkyl" includes linear alkyl, branched alkyl, cyclic alkyl, and alkyl groups combining two-way and three-way combinations of linear, branched, and cyclic groups. The alkyl groups can be unsubstituted or substituted. Specific examples of alkyl groups include methyl, ethyl, 1-propyl, 2-propyl, cyclopropyl, 1-butyl, 2-butyl, 2-methyl-1-propyl, tertiary-butyl, cyclobutyl, 1-methylcyclopropyl, 2-methylcyclopropyl, 1-pentyl, 2-pentyl, 3-pentyl, 2-methyl-1-butyl, 3-methyl-1-butyl, 2-methyl-2-butyl, 3-methyl-2-butyl, 2,2-dimethyl-1-propyl(neopentyl), cyclopentyl, 1-methylcyclobutyl, 2-methylcyclobutyl, 3-methylcyclobutyl, 1,2-dimethylcyclopropyl, 2,2-dimethylcyclopropyl, 2,3-dimethylcyclopropyl, 1-hexyl, 2-hexyl, 3-hexyl, 2-methyl-1-pentyl, 3-methyl-1-pentyl, 4-methyl-1-pentyl, 2-methyl-2-pentyl, 4-methyl-2-pentyl, 2-methyl-3-pentyl, 3-methyl-2-pentyl, 3-methyl-3-pentyl, 2,2-dimethyl-1-butyl, 3,3-dimethyl-1-butyl, 3,3-dimethyl-2-butyl, 2,3-dimethyl-1-butyl, 2,3-dimethyl-2-butyl, 1,2,2-trimethylcyclopropyl, 2,2,3-trimethylcyclopropyl, (1,2-dimethylcyclopropyl)methyl, (2,2-dimethylcyclopropyl)methyl, 1,2,3-trimethylcyclopropyl, (2,3-dimethylcyclopropyl)methyl, 2,2-dimethylcyclobutyl, 2,3-dimethylcyclobutyl, (1-methylcyclobutyl)methyl, 1,2-dimethylcyclobutyl, 2,3-dimethylcyclobutyl, (2-methylcyclobutyl)methyl, 1,3-dimethylcyclobutyl, 2,4-dimethylcyclobutyl, (3-methylcyclobutyl)methyl, 1-methylcyclopentyl, 2-methylcyclopentyl, cyclopentylmethyl, cyclohexyl, 1-norbornyl, 2-norbornyl, 3-norbornyl, 1-adamantyl, 2-adamantyl, octahydro-1-pentalenyl, octahydro-2-pentalenyl, octahydro-3-pentalenyl, octahydro-1-phenyl-1-pentalenyl, octahydro-2-phenyl-2-pentalenyl, octahydro-1-phenyl-3-pentalenyl, octahydro-2-phenyl-3-pentalenyl, decahydro-1-naphthyl, decahydro-2-naphthyl, decahydro-3-naphthyl, decahydro-1-phenyl-1-naphthyl, decahydro-2-phenyl-2-naphthyl, decahydro-1-phenyl-3-naphthyl, and decahydro-2-phenyl-3-naphthyl.

The copolymer comprises repeat units derived from an acid-labile monomer. In this context, "acid-labile" means that the monomer is reactive with acid derived from photoacid generator. Acid-labile monomers include carboxylic acid esters, acetals, and ketals.

Illustrative acid-labile carboxylic acid esters include the following unsubstituted and substituted tertiary hydrocarbyl (meth)acrylates

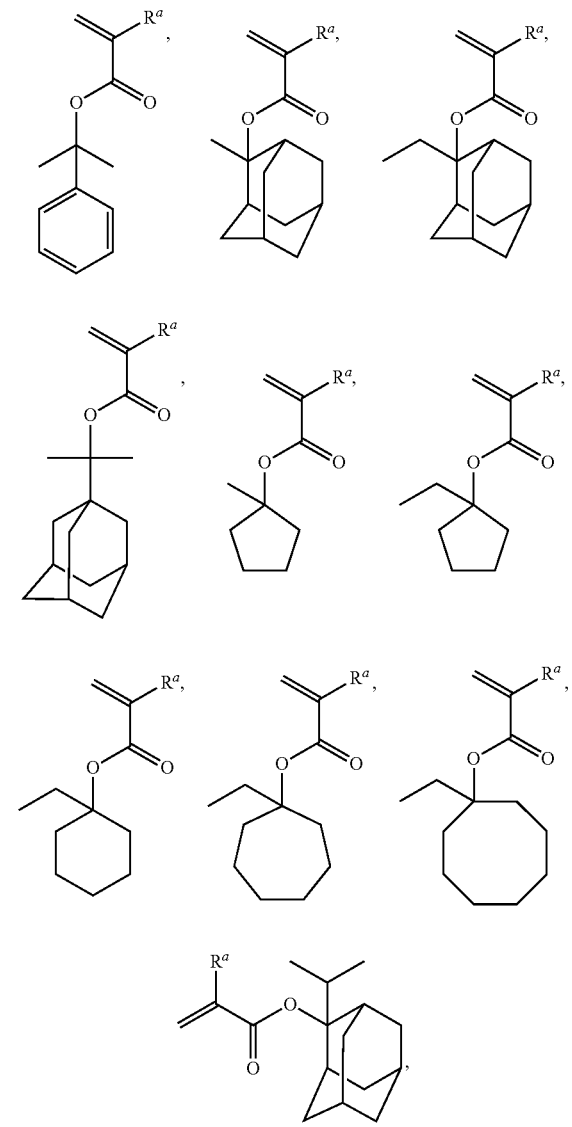

and combinations thereof, wherein R$^a$ is —H, —F, —CH$_3$, or —CF$_3$.

Illustrative acid-labile acetal- and ketal-substituted monomers include

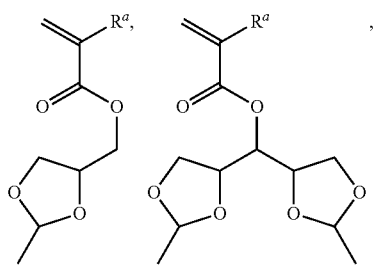

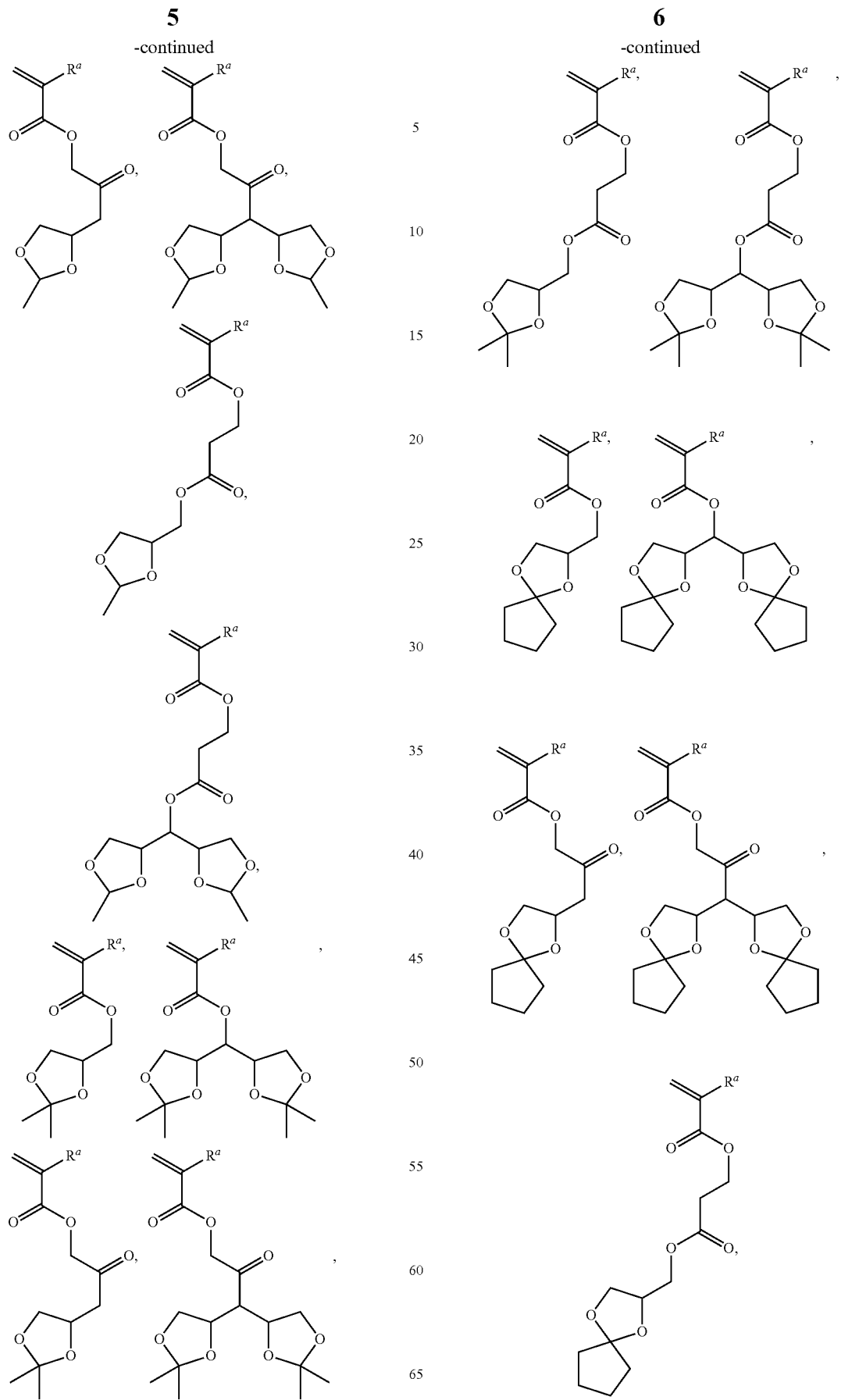

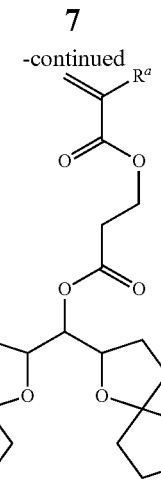

and combinations thereof, wherein $R^a$ is —H, —F, —CH$_3$, or —CF$_3$.

In some embodiments, the copolymer comprises repeat units derived from the acid-labile monomer in an amount of 5 to 40 weight percent, specifically 10 to 35 weight percent, more specifically 10 to 30 weight percent, based on the total weight of the copolymer.

In addition to repeat units derived from an acid-labile monomer, the copolymer comprises an aliphatic, lactone-containing monomer. Illustrative examples of aliphatic, lactone-containing monomers include

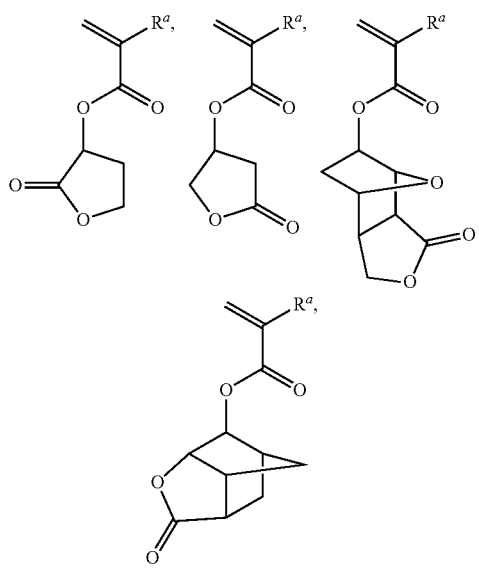

and combinations thereof, wherein $R^a$ is —H, —F, —CH$_3$, or —CF$_3$.

In some embodiments, the copolymer comprises repeat units derived from the aliphatic, lactone-containing monomer in an amount of 10 to 70 weight percent, specifically 20 to 60 weight percent, more specifically 25 to 50 weight percent, based on the total weight of the copolymer.

The copolymer further comprises repeat units derived from a base-soluble monomer comprising a 1,1,1,3,3,3-hexafluoro-2-hydroxyprop-2-yl substituent or a —NH—S(O)$_2$—R$^b$ substituent wherein R$^b$ is C$_{1-4}$ perfluoroalkyl. Illustrative examples of such monomers include

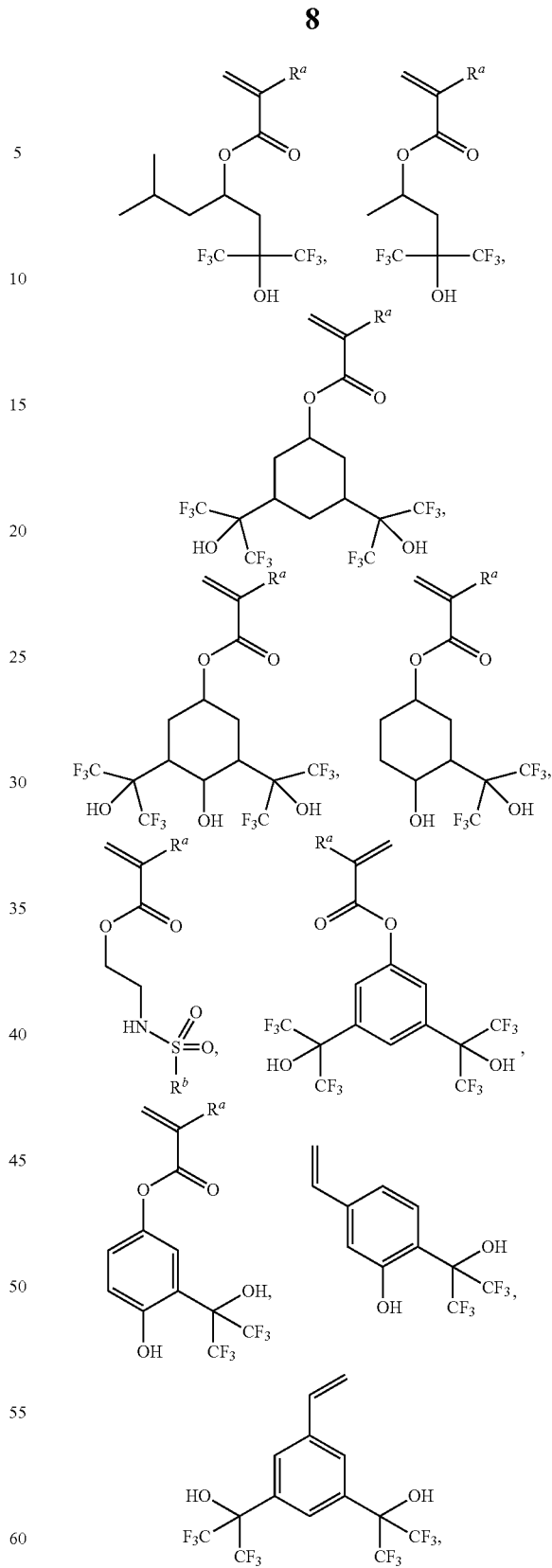

and combinations thereof, wherein $R^a$ is —H, —F, —CH$_3$, or —CF$_3$; and R$^b$ is C$_{1-4}$ perfluoroalkyl.

In some embodiments, the copolymer comprises the repeat units derived from the base-soluble monomer in an amount of 3 to 40 weight percent, specifically 5 to 35 weight percent, more specifically 10 to 30 weight percent, based on the total weight of the copolymer.

The copolymer further comprises repeat units derived from a photoacid-generating monomer comprising an aliphatic anion. In some embodiments, the photoacid-generating monomer is of the formula

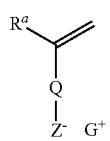

wherein $R^a$ is —H, —F, —CH$_3$, or —CF$_3$; Q is ester-containing or non-ester-containing, fluorinated or non-fluorinated C$_{1-20}$ alkylene, or C$_{3-20}$ cycloalkylene; Z$^-$ is an anionic moiety comprising sulfonate, sulfonamidate (anion of sulfonamide), or sulfonimidate (anion of sulfonamide); and G$^+$ is a sulfonium or iodonium cation.

Illustrative examples of such monomers include

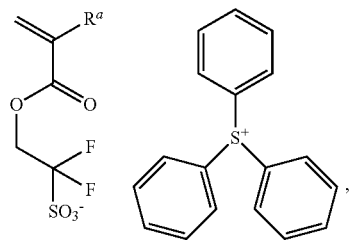

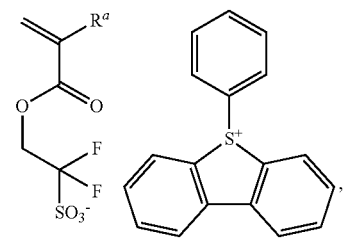

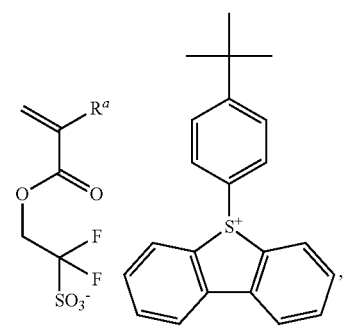

-continued

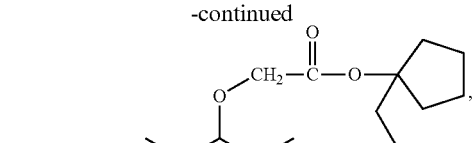

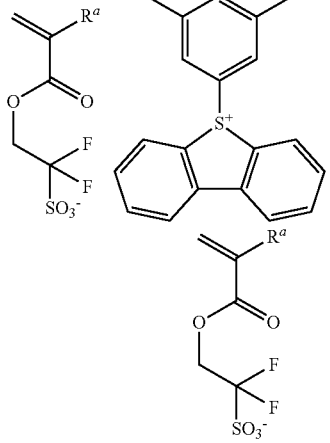

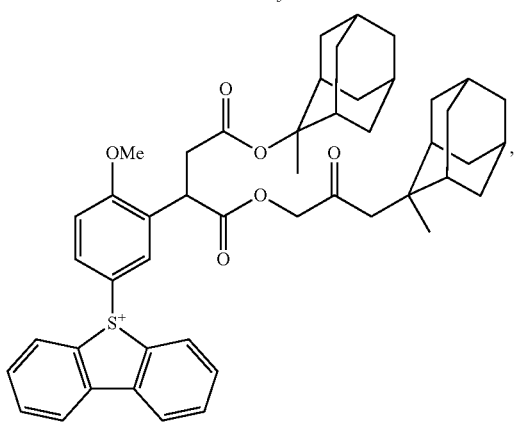

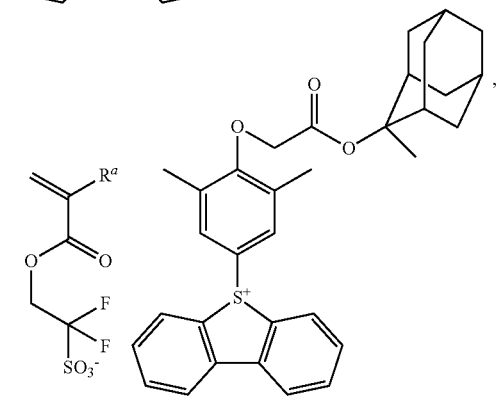

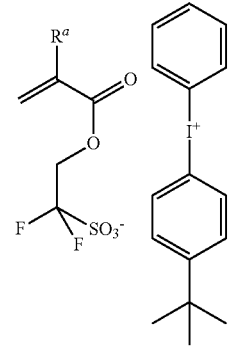

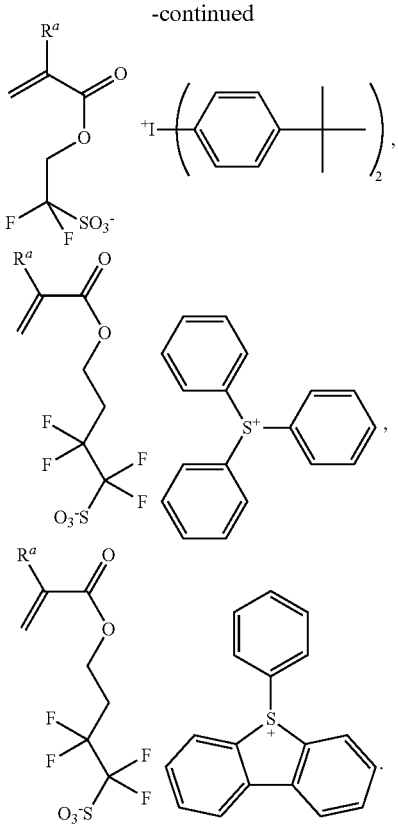

and combinations thereof, wherein $R^a$ is —H, —F, —CH$_3$, or —CF$_3$.

In some embodiments, the copolymer comprises the repeat units derived from the photoacid-generating monomer in an amount of 2 to 30 weight percent, specifically 2 to 28 weight percent, more specifically 3 to 25 weight percent, based on the total weight of the copolymer.

The copolymer further comprises repeat units derived from a neutral aromatic monomer having the formula

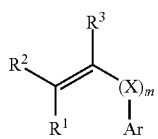

wherein $R^1$, $R^2$, and $R^3$ are each independently hydrogen, halogen, $C_{1-6}$ alkyl, or halogenated $C_{1-6}$ alkyl; m is 0 or 1; X is —O—, —C(O)—, —C(O)—O—, —S—, —S(O)—, —S(O)$_2$—, —S(O)$_2$—N(R$^4$)—, —N(R$^4$)—S(O)$_2$—, $C_{1-12}$ hydrocarbylene, —O—($C_{1-12}$ hydrocarbylene)-, —($C_{1-12}$ hydrocarbylene)-O—, or —C(O)—O—($C_{1-12}$ hydrocarbylene)-, wherein $R^4$ is $C_{1-6}$ alkyl; and Ar is an unsubstituted or substituted $C_{6-24}$ aryl, wherein when Ar is a substituted $C_{6-24}$ aryl, it is substituted with one or more groups selected from the group consisting of halogen, $C_{1-12}$ hydrocarbyl, and halogenated $C_{1-12}$ hydrocarbyl. In some embodiments, the neutral aromatic monomer has a calculated Log P (cLogP) value of 2.5 to 6. Within this range the cLogP value can be 2.5 to 5. P is the partition ratio of the monomer between 1-octanol and water. cLogP values can be calculated with, for example, MOLINSPIRATION CHEMINFORMATICS (http://www.molinspiration.com). The "neutral aromatic monomer" can be referred to as the "aromatic monomer" for brevity. The structure of the aromatic monomer has been defined such that it is free of groups that become protonated or react in an acidic medium, and free of groups that become ionized or react in a basic medium. Thus, the copolymer repeat unit derived from the aromatic monomer will be substantially electrically neutral and chemically unreactive in the presence of photogenerated acid, and in an alkaline developer such as 2.38 weight percent tetramethylammonium hydroxide.

In some embodiments of the aromatic monomer, $R^1$ and $R^2$ are hydrogen; $R^3$ is —H, —F, —CH$_3$, or —CF$_3$; X is —O—, —C(O)—O—, —($C_{1-12}$ hydrocarbylene)-, —O—($C_{1-12}$ hydrocarbylene)-, —($C_{1-12}$ hydrocarbylene)-O—, or —C(O)—O—($C_{1-12}$ hydrocarbylene)-; and Ar is unsubstituted or substituted phenyl, or unsubstituted or substituted naphthyl.

Illustrative examples of aromatic monomers include

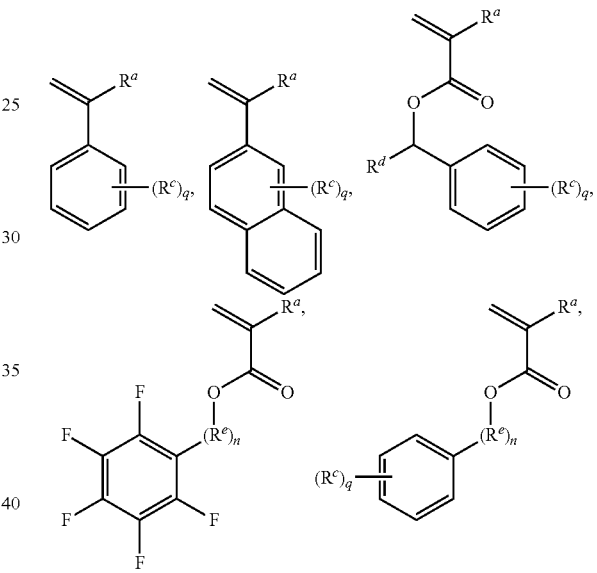

and combinations thereof, wherein $R^a$ is —H, —F, —CH$_3$, or —CF$_3$; each occurrence of $R^c$ is independently halogen, $C_{1-12}$ hydrocarbyl, $C_{2-10}$ alkenyl, $C_{1-6}$ perfluoroalkyl, or $C_{3-6}$ perfluorocycloalkyl; $R^d$ is $C_{1-10}$ alkyl, $C_{3-10}$ cycloalkyl, $C_{1-6}$ perfluoroalkyl, $C_{3-6}$ perfluorocycloalkyl, $C_{1-10}$ alkenyl, $C_{3-10}$ cycloalkenyl, or $C_{6-12}$ aryl; each occurrence of $R^e$ is independently $C_{1-10}$ alkylene or $C_{3-10}$ cycloalkylene; n is 0 or 1; and q is 0, 1, 2, 3, 4, or 5.

In some embodiments, the copolymer comprises the repeat units derived from the neutral aromatic monomer in an amount of 1 to 30 weight percent, specifically 2 to 25 weight percent, more specifically 2 to 20 weight percent, based on the total weight of the copolymer.

The monomers used to form the copolymer comprise no more than 55 mole percent of monomers comprising an aromatic group. Within this limit, the content of monomers comprising an aromatic group can be 5 to 55 mole percent, more specifically 10 to 50 mole percent, specifically 10 to 45 mole percent.

In some embodiments, the monomers used to prepare the copolymer exclude monomers comprising fluorenyl ester groups. Such monomers are described in U.S. Pat. No. 8,450,042 B2 to Hatakeyama et al.

In some embodiments, the monomers used to prepare the copolymer exclude monomers having both an acid-labile group that generates a base-soluble group (e.g., tertiary-alkyl (meth)acrylate ester), and a base-labile group that generates a group having increased solubility in alkali developer (e.g., a lactone-substituted alkyl(meth)acrylate). Such monomers are described in U.S. Patent Application Publication No. US 2012/0076997 A1 of Hirano et al. Due to the bulky side chain, polymerization of the monomers is expected to be challenging.

In some embodiments, the copolymer has a weight average molecular weight of 1,000 to 50,000 atomic mass units, specifically 2,000 to 30,000 atomic mass units, more specifically 3,000 to 20,000 atomic mass units, still more specifically 3,000 to 10,000 atomic mass units. In some embodiments, the dispersity of the copolymer, which is the ratio of weight average molecular weight to number average molecular weight is 1.1 to 3, specifically 1.1 to 2. Molecular weight values are determined by gel permeation chromatography using polystyrene standards.

In a very specific embodiment of the copolymer, the acid-labile monomer comprises

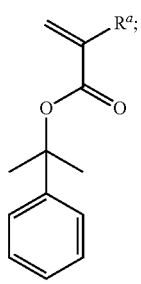

the aliphatic, lactone-containing (meth)acrylate ester comprises

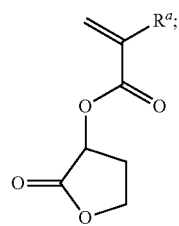

the $C_{1-12}$ alkyl(meth)acrylate in which the $C_{1-12}$ alkyl group comprises a 1,1,1,3,3,3-hexafluoro-2-hydroxyprop-2-yl substituent or a —NH—S(O)$_2$—R$^b$ substituent comprises

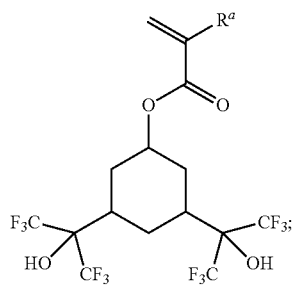

the photoacid-generating monomer comprises

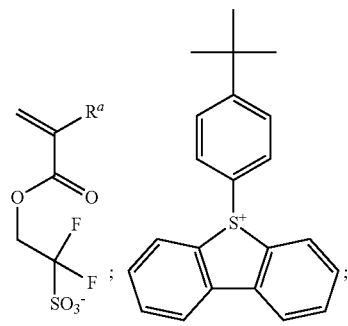

and
the neutral aromatic monomer comprises

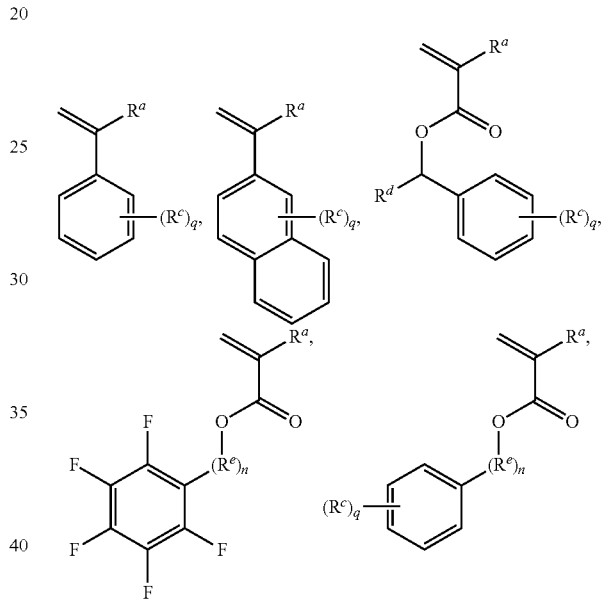

or a combination thereof, wherein $R^a$ is —H, —F, —CH$_3$, or —CF$_3$; $R^c$ is halogen, $C_{1-12}$ hydrocarbyl, $C_{1-6}$ perfluoroalkyl, $C_{3-6}$ perfluorocycloalkyl; $R^d$ is $C_{1-10}$ alkyl, $C_{3-10}$ cycloalkyl, $C_{1-6}$ perfluoroalkyl, $C_{3-6}$ perfluorocycloalkyl, $C_{1-10}$ alkenyl, $C_{3-10}$ cycloalkenyl, or $C_{6-12}$ aryl; $R^e$ is $C_{1-10}$ alkylene or $C_{3-10}$ cycloalkylene; n is 0 or 1; and q is 0, 1, 2, 3, 4, or 5.

One embodiment is a photoresist composition comprising the copolymer in any of its above-described variations. The photoresist composition can contain the copolymer is an amount of 50 to 99.9 weight percent, based on the total weight of solids (excluding solvent) in the photoresist composition. Within this range, the copolymer content of the photoresist can be 55 to 99.9 weight percent, specifically 65 to 99.9 weight percent.

The photoresist composition can further include one or more photoactive components such as photoacid generators, photobase generators, photoinitiators, additional (meth)acrylate-based polymers with or without bound photoacid generators, hydroxystyrene-based polymers with or without bound photoacid generators, and combinations thereof. The photoresist composition can further comprise polymers other than (meth)acrylate-based polymers and hydroxystyrene-based polymers such as, for example, the aromatic polyacetals described in U.S. Nonprovisional patent application Ser. No. 13/943,169, filed 16 Jul. 2013.

Photoacid generators can produce an acid when exposed to activating radiation, such as EUV radiation (e.g., at 193 nanometers), e-beam radiation, and other radiation sources. Photoacid generators generally include those photoacid generators suitable for the purpose of preparing photoresists. Photoacid generators include, for example, non-ionic oximes and various onium ion salts. Onium ions include, for example, unsubstituted and substituted ammonium ions, unsubstituted and substituted phosphonium ions, unsubstituted and substituted arsonium ions, unsubstituted and substituted stibonium ions, unsubstituted and substituted bismuthonium ions, unsubstituted and substituted oxonium ions, unsubstituted and substituted sulfonium ions, unsubstituted and substituted selenonium ions, unsubstituted and substituted telluronium ions, unsubstituted and substituted fluoronium ions, unsubstituted and substituted chloronium ions, unsubstituted and substituted bromonium ions, unsubstituted and substituted iodonium ions, unsubstituted and substituted aminodiazonium ions (substituted hydrogen azide), unsubstituted and substituted hydrocyanonium ions (substituted hydrogen cyanide), unsubstituted and substituted diazenium ions ($RN=N^+R_2$), unsubstituted and substituted iminium ions ($R_2C=N^+R_2$), quaternary ammonium ions having two double-bonded substituents ($R=N^+=R$), nitronium ion ($NO_2^+$), bis(trarylphosphine)iminium ions (($Ar_3P)_2N^+$), unsubstituted or substituted tertiary ammonium having one triple-bonded substituent ($R\equiv NH^+$), unsubstituted and substituted nitrilium ions ($RC\equiv NR^+$), unsubstituted and substituted diazonium ions ($N\equiv N^+R$), tertiary ammonium ions having two partially double-bonded substituents ($R=\!\!=\!\!= N^+H =\!\!=\!\!= R$), unsubstituted and substituted pyridinium ions, quaternary ammonium ions having one triple-bonded substituent and one single-bonded substituent ($R\equiv N^+R$), tertiary oxonium ions having one triple-bonded substituent ($R\equiv O^+$), nitrosonium ion ($N\equiv O^+$), tertiary oxonium ions having two partially double-bonded substituents ($R =\!\!=\!\!= O^+ =\!\!=\!\!= R$), pyrylium ion ($C_5H_5O^+$), tertiary sulfonium ions having one triple-bonded substituent ($R\equiv S^+$), tertiary sulfonium ions having two partially double-bonded substituents ($R =\!\!=\!\!= S^+ =\!\!=\!\!= R$), and thionitrosonium ion ($N\equiv S^+$). In some embodiments, the onium ion is selected from unsubstituted and substituted mono- or diaryiodonium ions, and unsubstituted and substituted mono-, di-, and triarylsulfonium ions. Examples of suitable onium salts can be found in U.S. Pat. No. 4,442,197 to Crivello et al., U.S. Pat. No. 4,603,101 to Crivello, and U.S. Pat. No. 4,624,912 to Zweifel et al.

Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable photoacid generators with specific examples are further described in U.S. Pat. No. 8,431,325 to Hashimoto et al. in column 37, lines 11-47 and columns 41-91.

Two specific PAGS are the following PAG1 and PAG2, the preparation of which is described in U.S. Patent Application Ser. No. 61/701,588, filed Sep. 15, 2012.

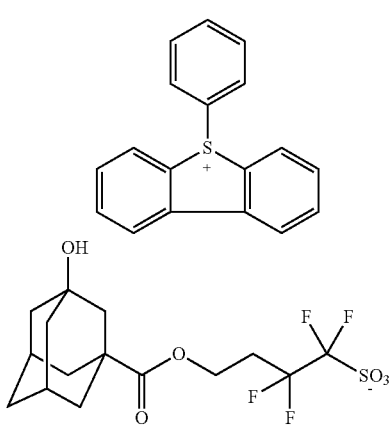

PAG1

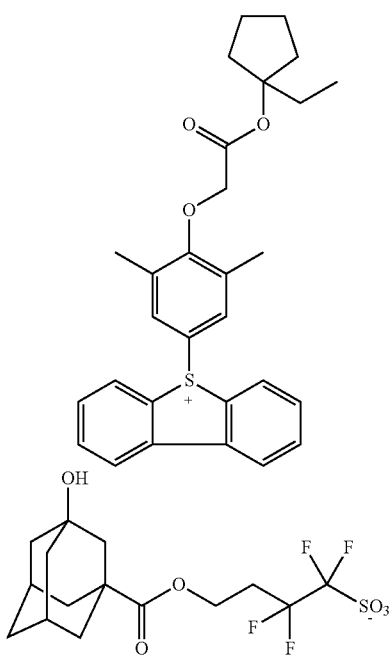

PAG2

Other suitable sulfonate PAGS include sulfonated esters and sulfonyloxy ketones. See *J. of Photopolymer Science and Technology*, 4(3):337-340 (1991), for disclosure of suitable sulfonate PAGS, including benzoin tosylate, t-butylphenyl α-(p-toluenesulfonyloxy)-acetate and t-butyl α-(p-toluenesulfonyloxy)-acetate. Preferred sulfonate PAGs are also disclosed in U.S. Pat. No. 5,344,742 to Sinta et al.

Other useful photoacid generators include the family of nitrobenzyl esters, and the s-triazine derivatives. Suitable s-triazine photoacid generators are disclosed, for example, in U.S. Pat. No. 4,189,323.

Photoacid generators further include photo-destroyable bases. Photo-destroyable bases include photo-decomposable cations, and preferably those useful for preparing PAGs, paired with an anion of a weak ($pK_a > 2$) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Exemplary photo-destroyable bases include those combining cations and anions of the following structures where the cation is triphenylsulfonium or one of the following:

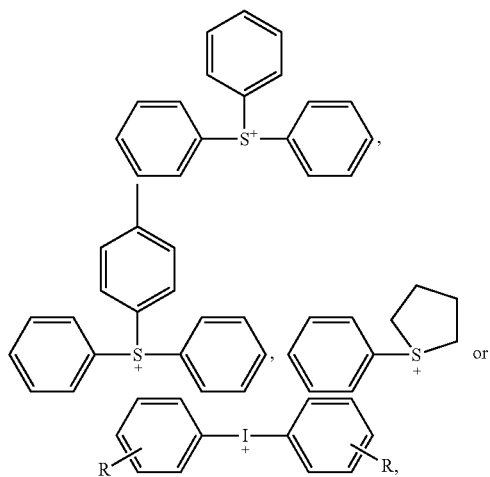

where R is independently H, a $C_{1-20}$ alkyl, a $C_{6-20}$ aryl, or a $C_{6-20}$ alkyl aryl, and the anion is

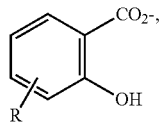

RC(=O)—O⁻, or ⁻OH,
where R is independently H, a $C_{1-20}$ alkyl, a $C_{1-20}$ alkoxyl, a $C_{6-20}$ aryl, or a $C_{6-20}$ alkyl aryl.

The photoresist can include a photobase generator, including those based on non-ionic photo-decomposing chromophores such as, for example, 2-nitrobenzyl groups and benzoin groups. An exemplary photobase generator is ortho-nitrobenzyl carbamate.

The photoresist can include a photoinitiator. Photoinitiators are used in the photoresist composition for initiating polymerization of the cross-linking agents by generation of free-radicals. Suitable free radical photoinitiators include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoinitiators are described in U.S. Pat. No. 2,760,863 and include vicinal ketaldonyl alcohols, such as benzoin, pivaloin, acyloin ethers, e.g., benzoin methyl and ethyl ethers; and alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators.

The photoresist composition can further include a surfactant. Illustrative surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX™ PF-636, PF-6320, PF-656, and PF-6520 fluorosurfactants from Omnova.

The photoresist composition can further include quenchers that are non-photo-destroyable bases. These include, for example, those based on hydroxides, carboxylates, amines, imines and amides. Such quenchers include $C_{1-30}$ organic amines, imines or amides, $C_{1-30}$ quaternary ammonium salts of strong bases (e.g., a hydroxide or alkoxide) or a weak base (e.g., a carboxylate). Exemplary quenchers include amines such as tripropylamine, dodecylamine, tris(2-hydroxypropyl)amine, tetrakis(2-hydroxypropyl)ethylenediamine; aryl amines such as diphenylamine, triphenylamine, aminophenol, and 2-(4-aminophenyl)-2-(4-hydroxyphenyl)propane, Troger's base; hindered amines such as diazabicycloundecene (DBU), diazabicyclononene (DBN), and tetrahydroxy isopropyl diamine and tert-butyl-4-hydroxy-1-piperidiene carboxylate; ionic quenchers including quaternary alkyl ammonium salts such as tetrabutylammonium hydroxide (TBAH), tetramethylammonium 2-hydroxybenzoic acid (TMA OHBA), and tetrabutylammonium lactate. Suitable quenchers are further described in U.S. Pat. No. 8,431,325 to Hashimoto et al.

The photoresist components are typically dissolved in a solvent for dispensing and coating. Exemplary solvents include anisole; alcohols including 1-methoxy-2-propanol, and 1-ethoxy-2 propanol; esters including n-butyl acetate, ethyl lactate, 1-methoxy-2-propyl acetate, methoxyethoxy propionate, ethoxyethoxy propionate, and methyl 2-hydroxyisobutyrate; ketones including cyclohexanone and 2-heptanone; and combinations thereof. The solvent amount can be, for example, 70 to 99 weight percent, specifically 85 to 98 weight percent, based on the total weight of the photoresist composition.

Photoresist compositions of the invention also may contain other materials. For example, other optional additives include actinic and contrast dyes, anti-striation agents, plasticizers, speed enhancers and sensitizers. Such optional additives typically will be present in minor concentration in a photoresist composition.

In some embodiments, the photoresist composition in solution comprises the polymer in an amount of 50 to 99.9 weight percent, specifically 55 to 99.9 weight percent, more specifically 65 to 99.9 weight percent, based on the total weight of solids. It will be understood that "polymer" used in this context of a component in a photoresist may mean only the copolymer disclosed herein, or a combination of the copolymer with another polymer useful in a photoresist. The photo-destroyable base may be present in the photoresist in an amount of 0.01 to 5 weight percent, specifically 0.1 to 4 weight percent, more specifically 0.2 to 3 weight percent, based on the total weight of solids. A surfactant may be included in an amount of 0.01 to 5 weight percent, specifically 0.1 to 4 weight percent, more specifically 0.2 to 3 weight percent, based on the total weight of solids. A photoacid generator is included in the amounts of 0 to 50 weight percent, specifically 1.5 to 45 weight percent, more specifically 2 to 40 weight percent, based on the total weight of solids. A quencher may be included in relatively small amounts of for example, from 0.03 to 5 weight percent based on the total weight of solids. Other additives may be included in amounts of less than or equal to 50 weight percent, specifically less than or equal to 35 weight percent, or more specifically less than or equal to 25 weight percent, based on the total weight of solids. The total solids content for the photoresist composition may be 0.5 to 50 weight percent, specifically 1 to 45 weight percent, more specifically 2 to 40 weight percent, and still more specifically 5 to 30 weight percent. It will be understood that total solids includes polymer, photo-destroyable base, quencher, surfactant, any added PAG, and any optional additives, exclusive of solvent.

Another embodiment is a negative tone photoresist comprising the copolymer. Preferred negative-acting compositions comprise a mixture of materials that will cure, crosslink, or harden upon exposure to acid, and one, two, or more photoacid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Application No. EP0164248 A2 of Feely, and U.S. Pat. No. 5,128,232 to Thackeray et al. Preferred phenolic polymers for use as the polymer binder component include novolaks and poly(vinylphenol)s. Preferred crosslinkers include amine-based materials, including melamine, glycolurils, benzoguanamine-based materials, and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames CYMEL™ 301, 303, 1170, 1171, 1172, 1123 and 1125 and BEETLE™ 60, 65 and 80.

Another embodiment is a coated substrate comprising: (a) a substrate having one or more layers to be patterned on a surface thereof; and (b) a layer of the photoresist composition over the one or more layers to be patterned.

The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, having one or more layers and patterned features formed on a surface thereof. Optionally, the underlying base substrate material itself may be patterned, for example, when it is desired to form trenches in the base substrate material. Layers formed over the base substrate material may include, for example, one or more conductive layers such as layers of aluminum, copper, molybdenum, tantalum, titanium, tungsten, and alloys, nitrides or silicides of such metals, doped amorphous silicon or doped polysilicon, one or more dielectric layers such as layers of silicon oxide, silicon nitride, silicon oxynitride or metal oxides, semiconductor layers, such as single-crystal silicon, underlayers, antireflective layers such as a bottom antireflective layers, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or spin-coating.

The invention further includes a method of forming an electronic device, comprising: (a) applying a layer of any of the photoresist compositions described herein on a substrate; (b) pattern-wise exposing the photoresist composition layer to activating (e.g., ultraviolet or electron beam) radiation; (c) developing the exposed photoresist composition layer to provide a resist relief image. The method can, optionally, further include (d) etching the resist relief pattern into the underlying substrate.

Applying the photoresist composition to the substrate can be accomplished by any suitable method, including spin coating, spray coating, dip coating, and doctor blading. In some embodiments, applying the layer of photoresist composition is accomplished by spin coating the photoresist in solvent using a coating track, in which the photoresist composition is dispensed on a spinning wafer. During dispensing, the wafer can be spun at a speed of up to 4,000 rotations per minute (rpm), specifically 500 to 3,000 rpm, and more specifically 1,000 to 2,500 rpm. The coated wafer is spun to remove solvent, and baked on a hot plate to remove residual solvent and free volume from the film to make it uniformly dense.

Pattern-wise exposure is then carried out using an exposure tool such as a stepper, in which the film is irradiated through a pattern mask and thereby is exposed pattern-wise. In some embodiments, the method uses advanced exposure tools generating activating radiation at wavelengths capable of high resolution including extreme-ultraviolet (EUV) or electron-beam (e-beam) radiation. It will be appreciated that exposure using the activating radiation decomposes the PAG in the exposed areas and generates acid and decomposition by-products, and that the acid then effects a chemical change in the polymer (deblocking the acid sensitive groups to generate a base-soluble group, or alternatively, catalyzing a crosslinking reaction in the exposed areas) during the post exposure bake (PEB) step. The resolution of such exposure tools can be less than 30 nanometers.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid-sensitive (deprotectable) groups, and the developer is preferably a metal-ion-free tetraalkylammonium hydroxide solution, such as, for example, aqueous 0.26 Normal tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist can, when used in one or more such a pattern-forming processes, be used to fabricate electronic and optoelectronic devices such as memory devices, processor chips (including central processing units or CPUs), graphics chips, and other such devices.

The invention is further illustrated by the following examples.

Examples

The acronyms and chemical structures of monomers used in these examples are presented in Table 1.

TABLE 1

| Monomer Acronym | Monomer Structure |
|---|---|
| α-GBLMA | 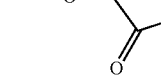 |
| CF3PPMA | 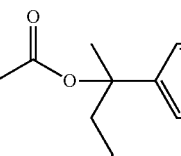 |
| DiHFA | 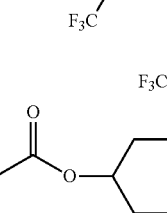 |
| ECP PDBT-F2 | 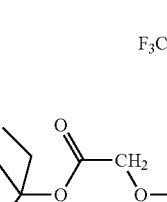 |
| PDBT-F2 | 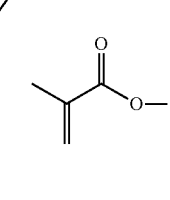 |
| PPMA | 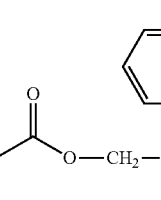 |

TABLE 1-continued

| Monomer Acronym | Monomer Structure |
|---|---|
| TBPPDBT-F2 | 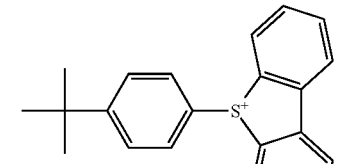 |
| Styrene | 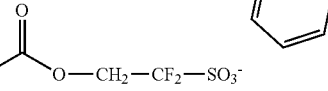 |
| PFBzMA |  |
| BzMA |  |

Synthesis of a (Comparative) PPMA/α-GBLMA/DiHFA/TBPPDBT-F2 Copolymer

A feed solution was made by dissolving PPMA (41.2 grams), α-GBLMA (45.35 grams), DiHFA (28.48 grams) and TBP PDBTS-F$_2$ (13.96 grams) in 130.8 grams of a 30:70 (v/v) mixture of ethyl lactate and gamma-butyrolactone. A heel solution was prepared by dissolving PPMA (2.69 grams), α-GBLMA (2.24 grams), DiHFA (3.92 grams) and TBPPDBTS-F$_2$ (2.13 grams) in 86.5 grams of a 30:70 (v/v) mixture of ethyl lactate and gamma-butyrolactone. An initiator solution was prepared by dissolving 14.6 grams of the azo initiator 2,2'-azobis(2,4-dimethyl valeronitrile) (obtained as V-65 from Wako Pure Chemical Industries, Ltd.) in 14.6 grams of a 2:1 (v/v) mixture of acetonitrile and tetrahydrofuran (THF).

The polymerization was carried out in a 2-liter, 3-neck round bottom flask fitted with a water condenser and a thermometer to monitor the reaction in the flask. The contents were stirred using an overhead stirrer. The reactor was charged with the heel solution and the contents were heated to 75° C. The feed solution and the initiator solution were fed into the reactor using syringe pumps over a 4 hour time period. The contents were then stirred for additional 2 hours, after which the reaction was quenched using hydroquinone (2.0 grams). The contents were cooled to room temperature, diluted with THF to 25 weight percent, and precipitated twice out of 10-fold (by weight) of a 95:5 (w/w) mixture of diisopropyl ether (IPE) and methanol (MeOH). After each precipitation step, the polymer obtained was dried under vacuum at 50° C. for 24 hours to yield 99 grams of a PPMA/α-GBLMA/DiHFA/TBPPDBT-F2 copolymer having the respective repeat units in a 34:50:10:6 mole ratio and a weight average molecular weight of 5,300 atomic mass units. This copolymer is designated Copolymer 1.

Synthesis of a (Comparative) CF3PPMA/α-GBLMA/DiHFA/PDBT-F2 Copolymer

A similar procedure was used to prepare a CF3PPMA/α-GBLMA/DiHFA/PDBT-F2 copolymer having the respective repeat units in a 36:47:11:6 mole ratio and a weight average molecular weight of 5,000 atomic mass units. This copolymer is designated Copolymer 2.

Lithographic Evaluation of PPMA/α-GBLMA/DiHFA/TBPPDBT-F2 and CF3PPMA/α-GBLMA/DiHFA/PPDBT-F2 Copolymers Table 2 summarizes the compositions and processing conditions for photoresists incorporating the PPMA/α-GBLMA/DiHFA/TBPPDBT-F2 and CF3PPMA/α-GBLMA/DiHFA/PDBT-F2 copolymers. In table two, component amounts are expressed in weight percent based on total solids excluding solvents. In Table 2, the photoacid generator DiMADMeOAC PDBT-ADOH has the chemical structure

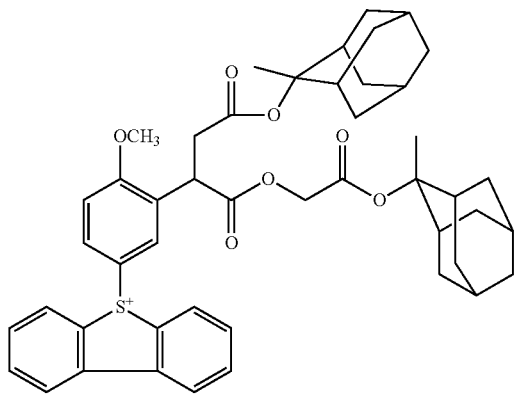

Also in Table 2, "PDQ" is photodecomposable quencher. The PDQ TBPPDBT-ADCA has the chemical structure

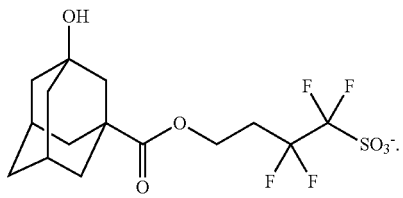

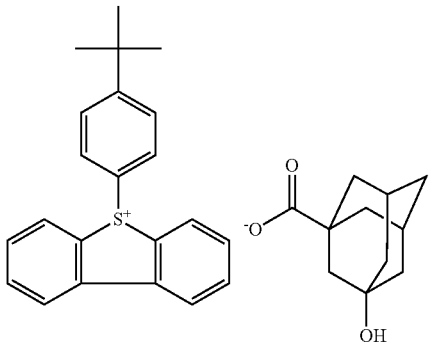

The quencher THIPDA has the chemical structure

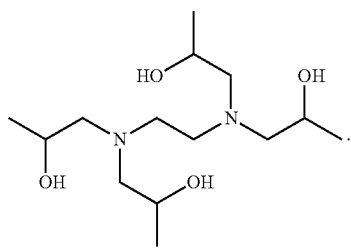 [SMILES: CC(O)CN(CCN(CC(C)O)CC(C)O)CC(C)O]

The surfactant POLYFOX™ PF-656, obtained from OMNOVA SOLUTIONS INC., has the chemical structure

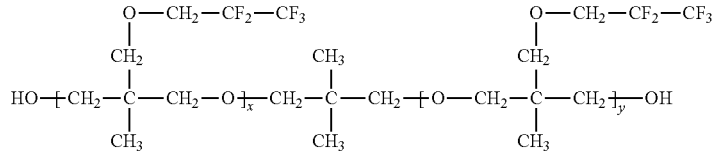

where x+y is, on average, about 6. "EL" is ethyl lactate, "HBM" is methyl 2-hydroxybutyrate.

TABLE 2

|  | Comparative Example 1 | Comparative Example 2 |
|---|---|---|
| Copolymer | 75.02% Copolymer 1 | 99.75% Copolymer 2 |
| PAG | 23.67% DiMADMeOAC PDBT-ADOH | none |
| PDQ, Quencher | 1.0016% TBPPDBT-ADCA, 0.225% THIPDA | 0.149% THIPDA |
| Surfactant solution | 0.075% POLYFOX™ PF-656 in 70:30 (w/w) EL/HBM | 0.0998% POLYFOX™ PF-656 in 70:30 (w/w) EL/HBM |
| Soft bake conditions | 110° C. for 90 seconds | 130° C. for 90 seconds |
| Post-exposure bake conditions | 100° C. for 60 seconds | 100° C. for 60 seconds |

FIG. 1 shows contact hole and line/space performance for the Comparative Example 1 photoresist, which was optimized for contact hole exposures, and the Comparative Example 2 photoresist, which was optimized for line exposures. For Comparative Example 1, 30 nanometer contact holes were well printed at 51 millijoules/centimeter² with a critical dimension uniformity (CDU) of 2.82 nanometers (FIG. 1(a)). However, when the same resist was evaluated for line/space application, resolution was limited by pattern collapse at 22 nanometers half pitch (FIG. 1(b)). For Comparative Example 2, a 17 nanometer resolution line/space was obtained (FIG. 1(c)), but the contact hole performance (FIG. 1(d)) was significantly worse than that of Comparative Example 1.

Figure 2:
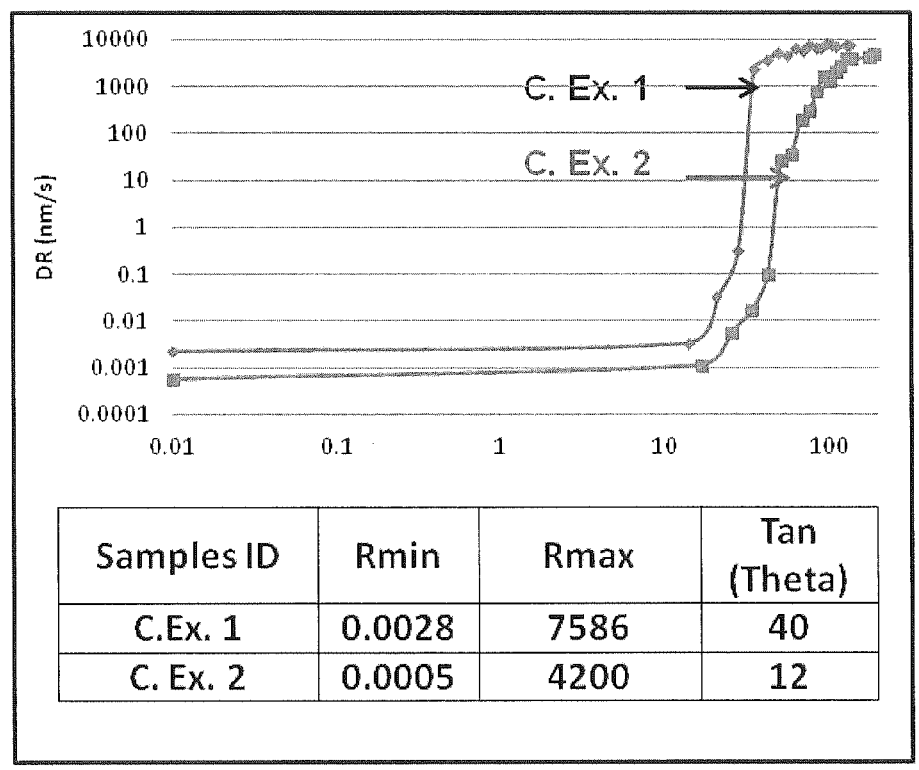
FIG. 2 is a plot of dissolution rate as a function of exposure dose for the photoresist compositions of Comparative Examples 1 and 2.

To address the question of why a contact hold resist fails in a line/space exposure and a line/space resist fails in a contact hole exposure, the above photoresist compositions were analyzed by monitoring the dissolution rate (DR) in tetramethylammonium hydroxide developer (0.26 Normal tetramethylammonium hydroxide, a standard developer used in the positive tone development) under 248 nanometer exposure. The dissolution rate data plotted in FIG. 2 were generated using a dissolution rate monitoring tool, LTJ ARM 800, employing a 470 nanometer monitoring wavelength. In the FIG. 2 plot, the x-axis is exposure dose, expressed in units of millijoules/centimeter² and plotted on a log scale, and the y-axis is dissolution rate, expressed in units of nanometers/second and plotted on a log scale. The Comparative Example 1 photoresist exhibits a higher $R_{max}$ value (about 7586 nanometers/second) and a steep contrast (Tan θ). In contrast, the Comparative Example 2 photoresist was characterized by a much shallower dissolution contrast and lower $R_{max}$ and $R_{min}$. The difference in performance of these resists is consistent with the difference in dissolution rates.

Since dissolution rate would be dependent on acid labile group content in the copolymer, three PPMA/α-GBLMA/DiHFA/PDBT-F2 copolymers with different levels of acid-labile monomers were synthesized and are summarized in Table 3. The 36/45/11/5 copolymer is the control system with 36 mole percent acid-labile monomer. The other two copolymers were synthesized with 26 and 21 mole percent acid-labile monomer. Each copolymer had a weight average molecular weight of about 5,000 atomic mass units.

TABLE 3

| Copolymer | Monomers | Monomer Ratio |
|---|---|---|
| 3 | PPMA/α-GBLMA/DiHFA/PDBT-F2 | 36:48:11:5 |
| 4 | PPMA/α-GBLMA/DiHFA/PDBT-F2 | 26:57:11:6 |
| 5 | PPMA/α-GBLMA/DiHFA/PDBT-F2 | 21:63:8:8 |

Photoresist compositions containing Copolymers 3-5 were formulated as summarized in Table 4, where component amounts are based on total solids, excluding solvents.

TABLE 4

| Photoresist | C. Ex. 3 | C. Ex. 4 | C. Ex. 5 |
|---|---|---|---|
| Copolymer | 99.75% Copolym. 3 | 99.75% Copolym. 4 | 99.75% Copolym. 5 |
| Quencher | 0.15% THIPDA | 0.15% THIPDA | 0.15% THIPDA |
| Surfactant solution | 0.0998% POLYFOX™ PF-656 in 70:30 (w/w) EL/HBM | 0.0998% POLYFOX™ PF-656 in 70:30 (w/w) EL/HBM | 0.0998% POLYFOX™ PF-656 in 70:30 (w/w) EL/HBM |
| Soft-bake conditions | 110° C. for 90 seconds | 110° C. for 90 seconds | 110° C. for 90 seconds |
| Post-exposure bake conditions | 100° C. for 60 seconds | 100° C. for 60 seconds | 100° C. for 60 seconds |

Photolithographic results are presented in Table 5, where "UFTL" is the unexposed film thickness loss, expressed in Angstroms, "$R_{min}$," is the dissolution rate of unexposed resist expressed in nanometers per second, "$R_{max}$" is the dissolution rate of fully exposed resist expressed in nanometers per second, and "248 nm $E_0$" is the 248 nanometer exposure dose to clear expressed in millijoules/centimeter². The results show that the copolymers with lower acid-labile monomer contents exhibited significant reductions in $R_{max}$. Since the UFTL values for Comparative Examples 4 and 5 were significantly elevated, they were not evaluated by EUV lithography. A high UFTL could potentially impart severe top loss (mottling) and reduce the aspect ratio after the development cycle.

TABLE 5

| Photoresist | UFTL (Å) | $R_{min}$ (nm/s) | $R_{max}$ (nm/s) | 248 nm $E_0$ (mJ/cm²) |
|---|---|---|---|---|
| C. Ex. 3 | 8 | 0.005 | 6930 | 27 |
| C. Ex. 4 | 29 | 0.03 | 3376 | 24 |
| C. Ex. 5 | 54 | 0.04 | 1935 | 24 |

Additional copolymers were synthesized to explore the effects of incorporating the neutral aromatic monomers, styrene, PFBzMA, and BzMA. The copolymer compositions are summarized in Table 6. Polymer 8 was synthesized as follows. A feed solution was made by dissolving PPMA (0.37 grams), α-GBLMA (0.31 grams), DiHFA (0.54 grams) and TBPPDBT-F2 (0.3 grams) in 14 grams of a 70:30 (v/v) mixture of gamma-butyrolactone and ethyl lactate. A heel solution was prepared by dissolving PPMA (4.14 grams), α-GBLMA (6.51 grams), DiHFA (4.34 grams), styrene (0.88 grams) and TBPPDBT-F2 (2.04 grams) in 18.13 grams of a 70:30 (v/v) mixture of gamma-butyrolactone and ethyl lactate. An initiator solution was prepared by dissolving 2.1 gram of the azo initiator 2,2'-azobis(2,4-dimethyl valeronitrile) (obtained from Wako Pure Chemical Industries, Ltd.) in 2.01 g of 2:1 (v/v) mixture of acetonitrile and tetrahydrofuran. The polymerization was carried out in a 300 milliliter, 3-neck round-bottom flask fitted with a water condenser and a thermometer to monitor the reaction temperature in the flask. The reactor was charged with the heel solution and the contents were heated to 75° C. The feed solution and heel solution were fed into the reactor using syringe pumps over a period of 4 hours The contents were then stirred for an additional 2 hours, after which the reaction was quenched using hydroquinone (0.2 grams). The contents were cooled to room temperature, diluted with THF to 25 weight percent, and precipitated twice out of 10 fold (by weight) of a 95:5 (w/w) mixture of IPE and MeOH. The polymer obtained after each precipitation step was dried under vacuum at 50° C. for 24 hours to yield 8 grams of PPMA/α-GBLMA/DiHFA/Styrene/TBPP-DBT-F2 copolymer. Other polymers listed in table 6 were synthesized in a similar way except for a change in the type and/or content of the neutral monomer employed.

TABLE 6

| Copolymer | Monomers | Monomer Ratio |
|---|---|---|
| 6 | PPMA/α-GBLMA/DiHFA/TBPPDBT-F2 | 35/48/12/5 |
| 7 | PPMA/α-GBLMA/DiHFA/TBPPDBT-F2 | 26/58/11/5 |
| 8 | PPMA/α-GBLMA/DiHFA/TBPPDBT-F2/Styrene | 26/47/12/5/10 |
| 9 | PPMA/α-GBLMA/DiHFA/TBPPDBT-F2/Styrene | 16/47/12/5/20 |
| 10 | PPMA/α-GBLMA/DiHFA/TBPPDBT-F2/PFBzMA | 36/47/12/5 |
| 11 | PPMA/α-GBLMA/DiHFA/TBPPDBT-F2/BzMA | 36/47/12/5 |
| 12 | PPMA/α-GBLMA/DiHFA/ECPPDBT-F2 | 36/47/12/5 |

Photoresist compositions containing Copolymers 6-12 were formulated as summarized in Table 7, where component amounts are based on total solids, excluding solvents. The photoacid generator TBPPDBT DHC has the chemical structure

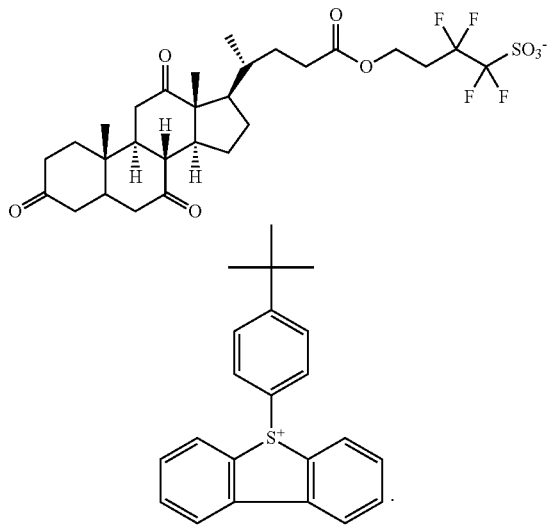

All formulations in Table 7 used a 70:30 (w/w) mixture of ethyl lactate and gamma-butyrolactone as solvent. The resists were processed at a soft bake of 110° C. for 90 seconds and a post-exposure base at 100° C. for 60 seconds. Contrast curves at 248 nanometers were generated by coating the resist on a 60 nanometer thick organic antireflective layer (Dow Electronic Materials AR™ 9-900). The resist was exposed at 248 nanometers on a Canon TELACT tool. After post-exposure bake, the resists were developed for 60 seconds using 0.26 Normal tetramethylammonium hydroxide solution. Film thickness values were measured using KLA Tencore OPTIPROBE™ 7341 thermal wave tool.

TABLE 7

| Photoresist | Copolymer | Quencher | PAG | surfactant |
|---|---|---|---|---|
| C. Ex. 6 | 99.75% Copolymer 6 | 0.149% THIPDA | none | 0.099% POLYFOX™ PF-656 |
| C. Ex. 7 | 99.75% Copolymer 7 | 0.149% THIPDA | none | 0.099% POLYFOX™ PF-656 |
| Ex. 1 | 99.75% Copolymer 8 | 0.149% THIPDA | none | 0.099% POLYFOX™ PF-656 |
| Ex. 2 | 72.56% Copolymer 8 | 0.82% THIPDA | 26.5% TBPPDBT DHC | 0.072% POLYFOX™ PF-656 |
| Ex. 3 | 99.75% Copolymer 9 | 0.15% THIPDA | none | 0.099% POLYFOX™ PF-656 |
| Ex. 4 | 72.56% Copolymer 9 | 0.82% THIPDA | 26.5% TBPPDBT DHC | 0.072% POLYFOX™ PF-656 |
| Ex. 5 | 99.75% Copolymer 10 | 0.15% THIPDA | none | 0.099% POLYFOX™ PF-656 |
| Ex. 6 | 72.53% Copolymer 10 | 0.87% TIPA* | 26.5% TBPPDBT DHC | 0.072% POLYFOX™ PF-656 |
| Ex. 7 | 99.75% Copolymer 11 | 0.15% THIPDA | none | 0.099% POLYFOX™ PF-656 |
| C. Ex. 8 | 72.37% Copolymer 12 | 1.085% TIPA | 26.4% TBPPDBT DHC | 0.072% POLYFOX™ PF-656 |

*TIPA = triisopropylamine

Photolithographic results are summarized in Table 8 for the photoresist compositions of Table 7. In Table 8, "EUV Es" is the sizing energy, expressed in millijoules/centimeter$^2$, at 26 nanometer critical dimension using extreme ultraviolet exposure. For the photoresist compositions with no added PAG (Comparative Examples 6 and 7, Examples 1, 3, 5, and 7), the inventive photoresists of Examples 1, 3, 5, and 7 incorporated a copolymer with repeat units derived from a neutral aromatic monomer. These photoresists exhibited lower $R_{max}$ values relative to Comparative Example 6, in which the copolymer that does not incorporate a neutral aromatic monomer, and Comparative Examples 7, in which the copolymer that does not incorporate a neutral aromatic monomer and does have a lower content of acid-labile groups. It was also observed that the incorporation of the neutral aromatic monomer, even with lower acid labile group content, yields a UFTL which was not significantly higher than that of the photoresist in Comparative Example 7. This result is unlike the one shown in Table 5, where the decrease in the acid labile group content in the copolymer was associated with a significant increase in UFTL. For the photoresist compositions of Comparative Example 8 and Examples 2, 4, and 6) which contain added PAG in the formulation, the inventive photoresists of Examples 2, 4 and 6, in which the copolymer incorporates a neutral aromatic monomer, exhibited much lower $R_{max}$ values relative to Comparative Example 8. A higher UFTL and $R_{min}$ were observed for all formulations containing added PAG as opposed to low UFTL and $R_{min}$ for compositions without added PAG.

TABLE 8

| Photoresist | 248 nm E$_0$ (mJ/cm$^2$) | EUV Es 26 nm CD (mJ/cm$^2$) | UFTL (Å) | R$_{min}$ (nm/s) | R$_{max}$ (nm/s) | Tanθ |
|---|---|---|---|---|---|---|
| C. Ex. 6 | 38 | 15.29 | 4 | 0.005 | 4500 | 12 |
| C. Ex. 7 | 45 | 15.29 | 16 | 0.01 | 2400 | 12 |
| Ex. 1 | 44 | 18.68 | 3 | 0.007 | 1750 | 10 |
| Ex. 3 | 63 | 22.08 | 7 | 0.01 | 212 | 7 |
| Ex. 5 | 57 | 22.28 | 1 | 0.007 | 1140 | 11 |
| Ex. 7 | 49 | 18.44 | 2 | 0.007 | 1670 | 14 |
| C. Ex. 8 | 36 | 14 | 13 | 0.01 | 7374 | 18 |
| Ex. 2 | 38 | 17.6 | 20 | 0.014 | 2189 | 12 |
| Ex. 4 | 52 | 20.7 | 40 | 0.03 | 775 | 8 |
| Ex. 6 | 37 | 19.0 | 15 | 0.012 | 1006 | 12 |

Figure 3:
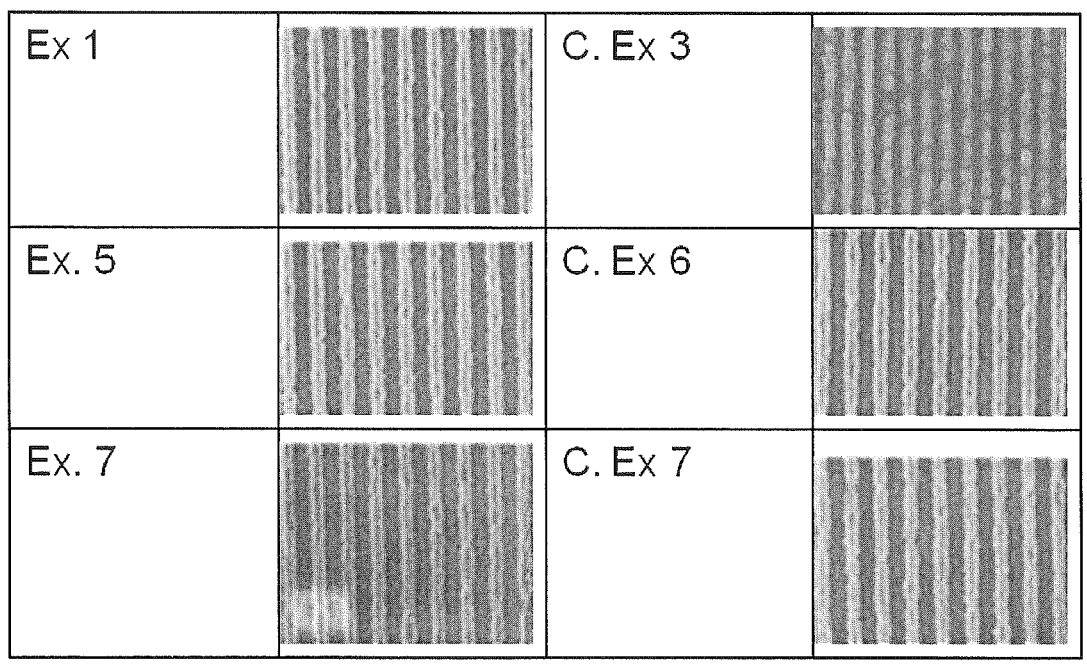
FIG. 3 shows top-down scanning electron microscopy (SEM) images for Comparative Example 3 at 26 nanometer critical dimension, and Comparative Examples 6 and 7, and Examples 1, 5, and 7, all at 21 nanometer critical dimension, after extreme ultraviolet (EUV) patterning.

The Example 1, 3, and 7 and Comparative Example 6 and 7 photoresists were evaluated for line/space performance at the Lawrence Berkeley National Laboratory (LBNL) eMET tool. The photoresists were coated at a 50 nanometer thickness on a silicon wafer that had been pre-coated at a 25 nanometer thickness with a Si-based antireflective layer. The Example 2, 4, and 6 and Comparative Example 8 photoresists were evaluated for line/space performance at the Albany eMET tool. The photoresists were coated at a 40 nanometer thickness on a silicon wafer that had been pre-coated at a 25 nanometer thickness with a polyester-based antireflective layer. The resist was pre-baked at 110° C. for 90 seconds followed by a pattern-wise exposure with EUV light. After post-exposure bake at 100° C. for 60 seconds, the resist was developed with 0.26 Normal tetramethylammonium hydroxide for 30 seconds. FIG. 3 shows the 26 nanometer line/space performance for the inventive photoresists of Examples 1, 5, and 7 and comparative photoresists of Comparative Examples 6 and 7. The top-down scanning electron micrographs of the inventive photoresists of examples 1, 5, and 7 exhibit a reduction in mottling at overexposure.

Figure 4:
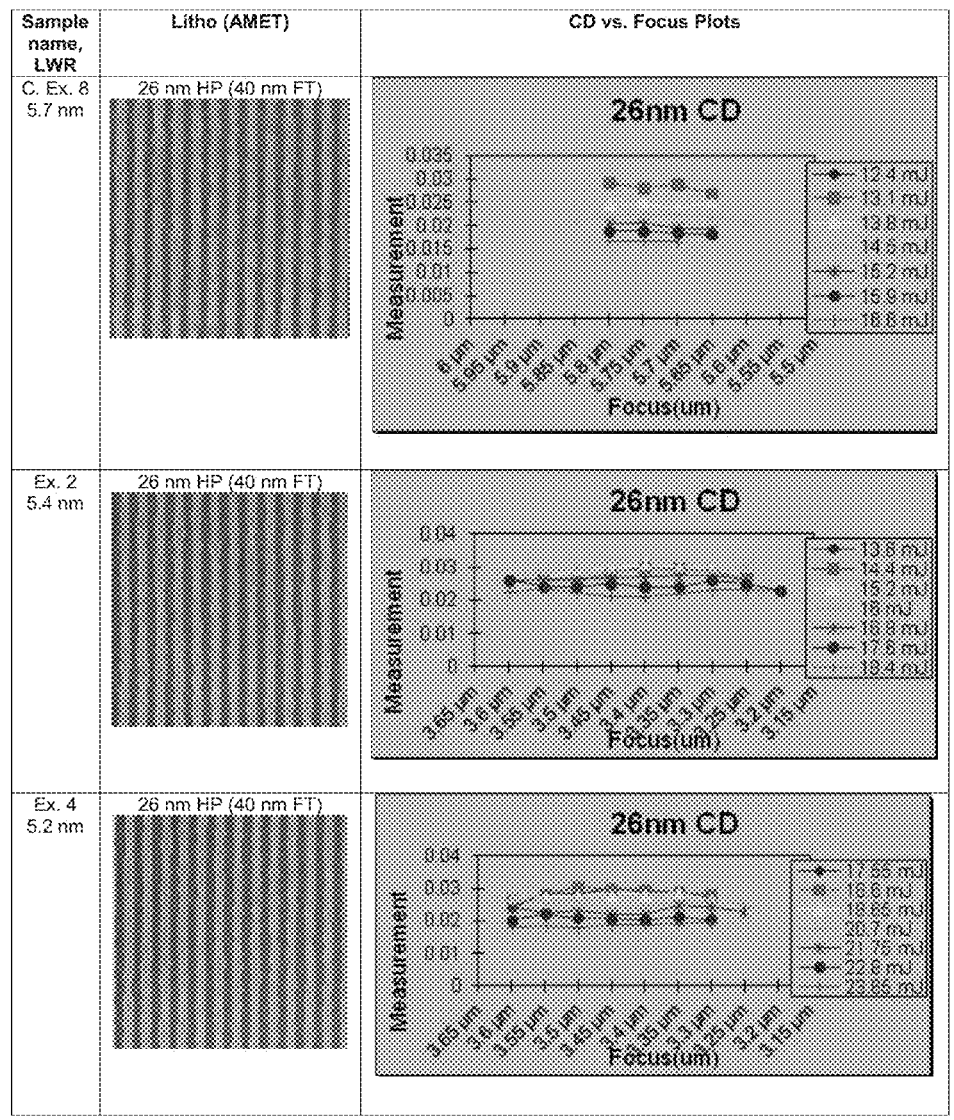
FIG. 4, on the left side, shows 26 nanometer line/space performance for the inventive photoresist compositions of Examples 2 and 4 and the comparative photoresist composition of Comparative Example 8; on the right side are corresponding plots of critical dimension (CD; nm) versus focus as a function of dose (mJ/cm$^2$) symbolized with different line types.

FIG. 4 shows the 26 nanometer line/space performance for the inventive photoresists of Examples 2 and 4 and the comparative photoresist of Comparative Example 8. The inventive photoresists of Examples 2 and 4 exhibit a reduction in mottling and increase in depth of focus.

Figure 5:
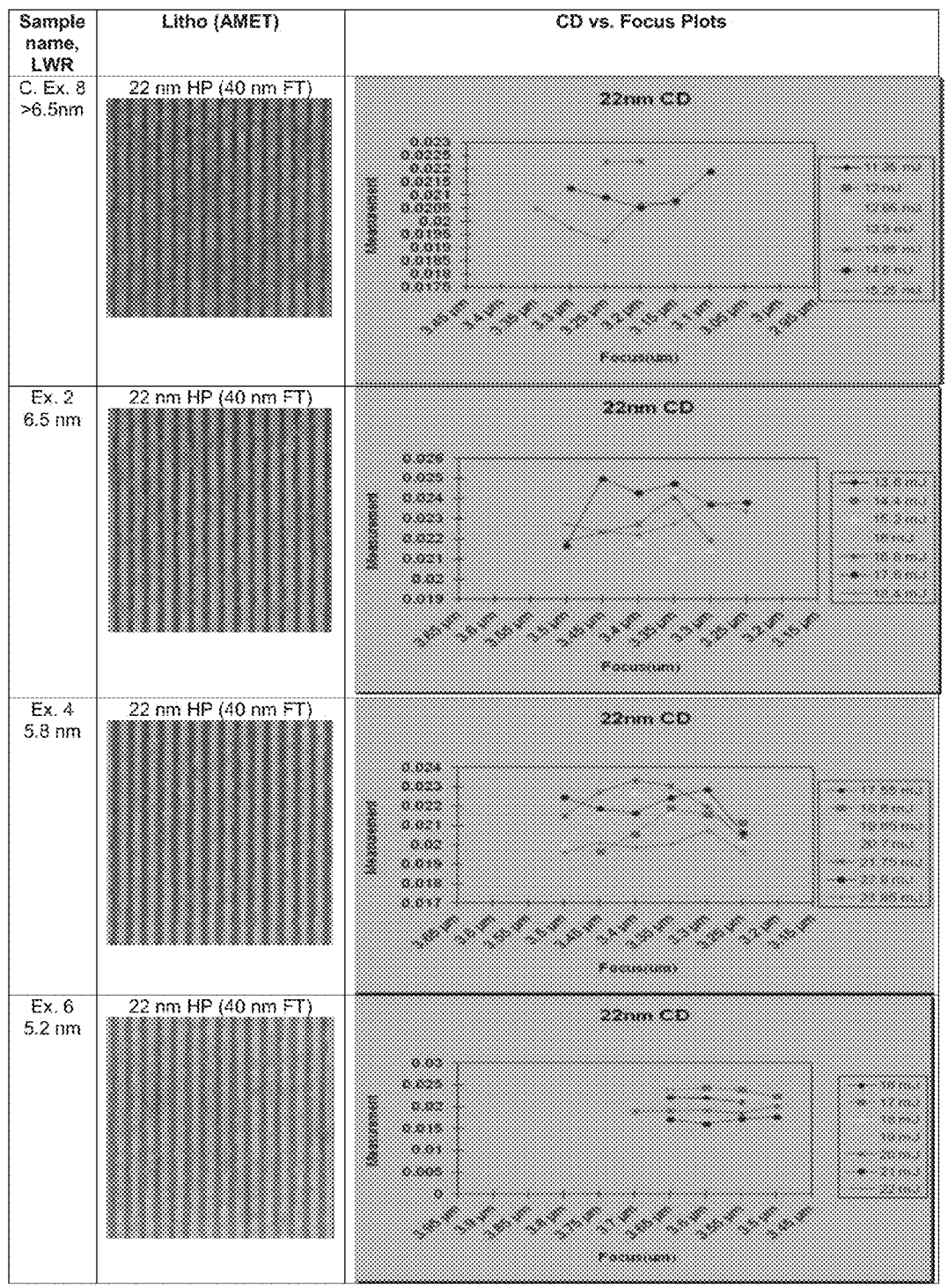
FIG. 5, on the left side, shows 22 nanometer line/space performance for Examples 2, 4, and 6, and Comparative Example 8; on the right side are corresponding plots of critical dimension (CD; nm) versus focus as a function of dose (mJ/cm$^2$).

FIG. 5 shows the 22 nanometer line/space performance for Examples 2, 4, and 6, and Comparative Example 8. The inventive photoresists of Examples 2, 4, and 6 exhibit a reduction in mottling and increase in depth of focus.

The invention claimed is:

1. A copolymer comprising repeat units derived from
an acid-labile monomer;
an aliphatic, lactone-containing monomer;
a base-soluble monomer comprising a 1,1,1,3,3,3-hexafluoro-2-hydroxyprop-2-yl substituent or a —NH—S(O)$_2$—R$^b$ substituent wherein R$^b$ is C$_{1-4}$ perfluoroalkyl;
a photoacid-generating monomer comprising an aliphatic anion; and
a neutral aromatic monomer comprising

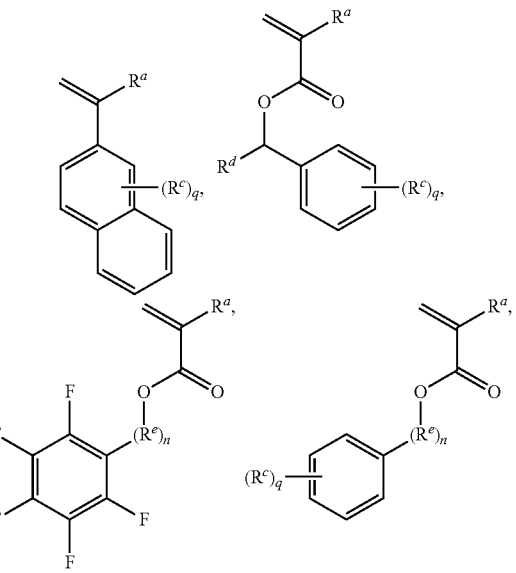

or a combination thereof, wherein R$^a$ is —H, —F, —CH$_3$, or —CF$_3$; each occurrence of R$^c$ is independently halogen, C$_{1-6}$ perfluoroalkyl, or C$_{3-6}$ perfluorocycloalkyl; R$^d$ is C$_{1-10}$ alkyl, C$_{3-10}$ cycloalkyl, C$_{1-6}$ perfluoroalkyl, C$_{3-6}$ perfluorocycloalkyl, C$_{1-10}$ alkenyl, C$_{3-10}$ cycloalkenyl, or C$_{6-12}$ aryl; each occurrence of R$^e$ is independently C$_{1-10}$ alkylene or C$_{3-10}$ cycloalkylene; n is 1; and q is 1, 2, 3, 4, or 5;
wherein the repeat units are derived from monomers comprising no more than 55 mole percent of monomers comprising an aromatic group.

2. The copolymer of claim 1, wherein the neutral aromatic monomer has a cLogP of 2.5 to 6.

3. The copolymer of claim 1, wherein the acid-labile monomer comprises an unsubstituted or substituted tertiary hydrocarbyl(meth)acrylate comprising

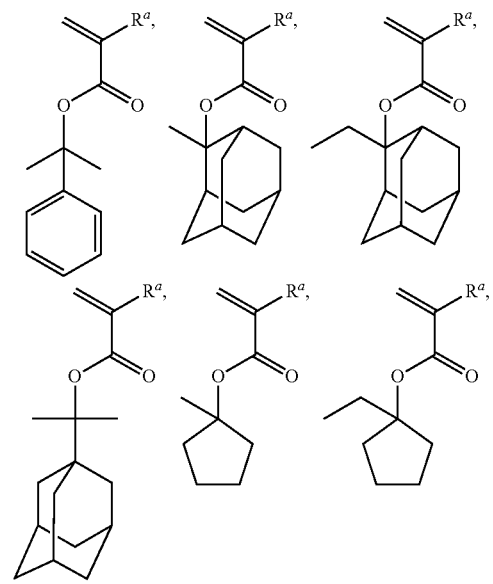

-continued
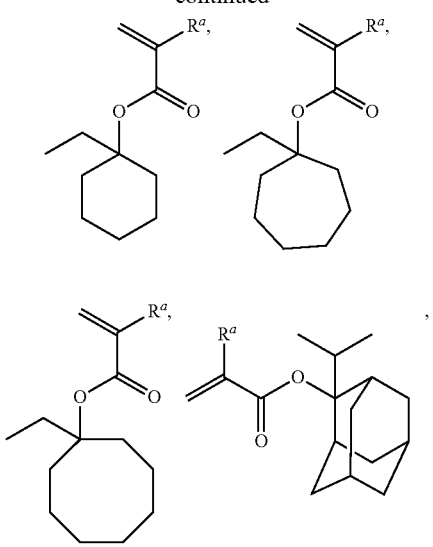
or a combination thereof; wherein $R^a$ is —H, —F, —CH$_3$, or —CF$_3$.
4. The copolymer of claim 1, wherein the base-soluble monomer comprises
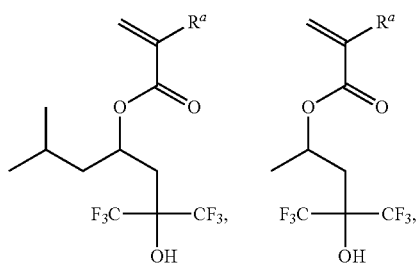
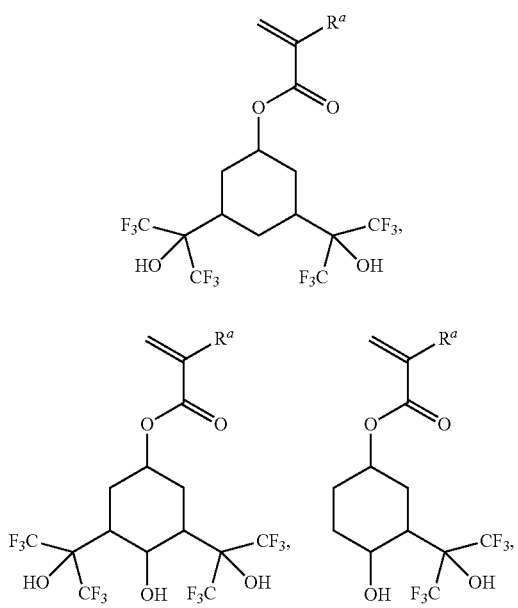
-continued
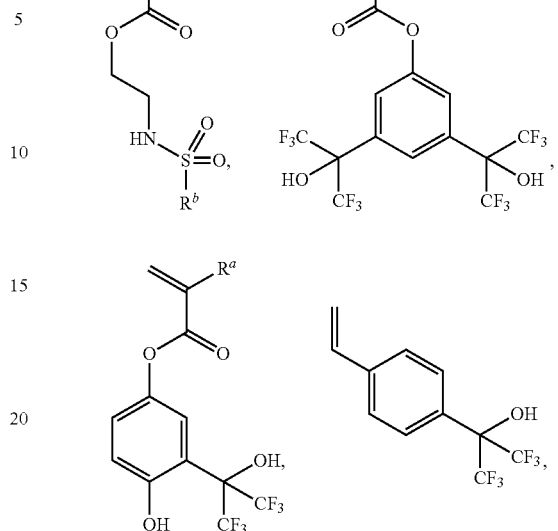
or a combination thereof, wherein $R^a$ is —H, —F, —CH$_3$, or —CF$_3$; and $R^b$ is C$_{1-4}$ perfluoroalkyl.
5. The copolymer of claim 1, wherein the photoacid-generating monomer comprises
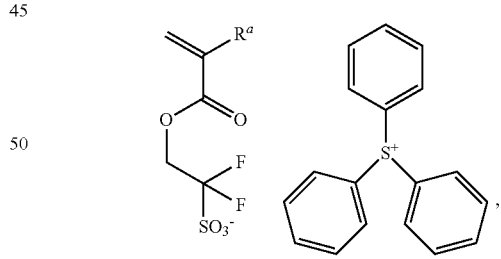
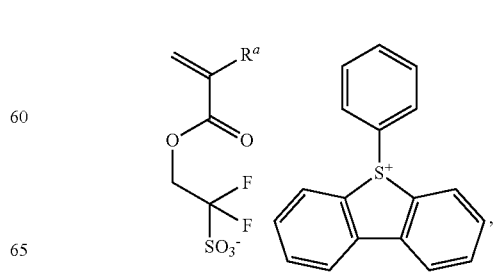

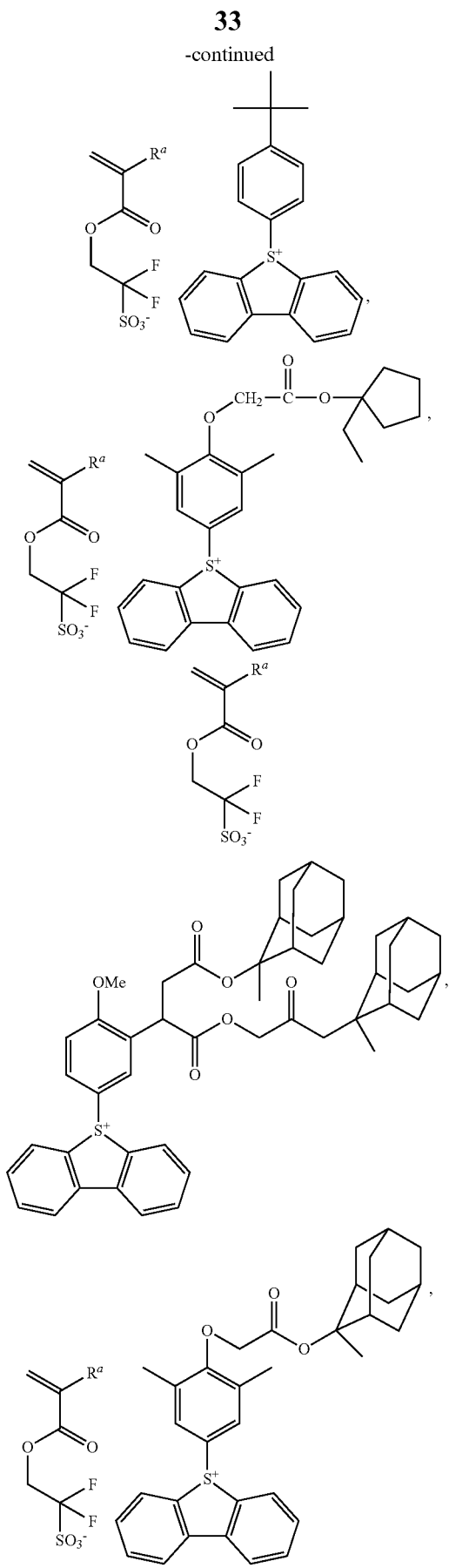

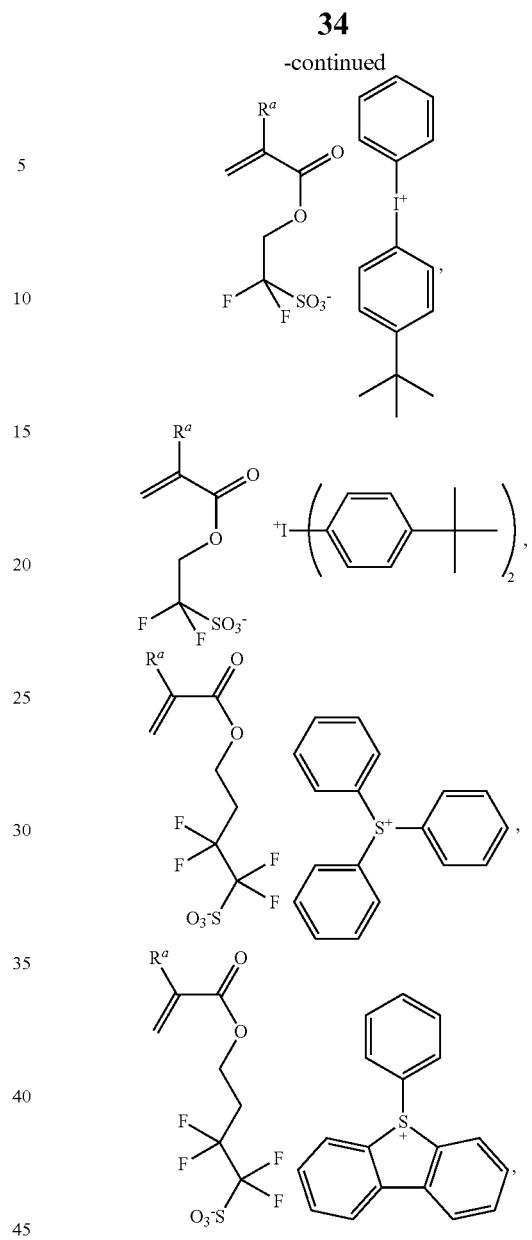

or a combination thereof, wherein $R^a$ is —H, —F, —CH$_3$, or —CF$_3$.

6. A photoresist composition comprising the copolymer of claim 1.

7. A coated substrate comprising:
   (a) a substrate having one or more layers to be patterned on a surface thereof; and
   (b) a layer of the photoresist composition of claim 6 over the one or more layers to be patterned.

8. A method of forming an electronic device, comprising:
   (a) applying a layer of a photoresist composition of claim 6 on a substrate;
   (b) pattern-wise exposing the photoresist composition layer to extreme ultraviolet or electron beam activating radiation; and
   (c) developing the exposed photoresist composition layer to provide a resist relief image.

9. The copolymer of claim 1, wherein the photoacid-generating monomer comprises a cation having the structure

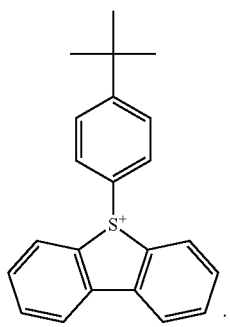 [SMILES: CC(C)(C)c1ccc(-[s+]2c3ccccc3c3ccccc32)cc1]

10. The copolymer of claim 9, wherein the photoacid-generating monomer comprises an anion having the structure

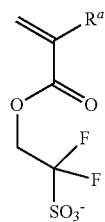

wherein $R^a$ is —H, —F, —CH$_3$, or —CF$_3$.

11. A copolymer comprising repeat units derived from an acid-labile monomer comprising

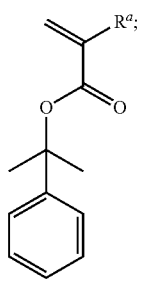

an aliphatic, lactone-containing monomer comprising

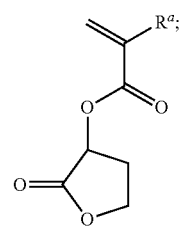

a base-soluble monomer comprising

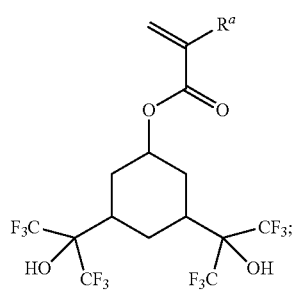

a photoacid-generating monomer comprising

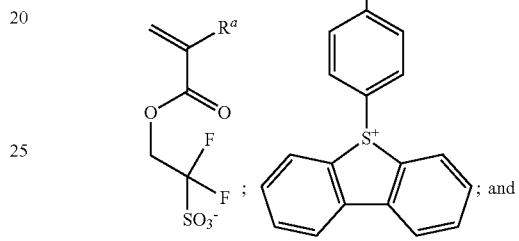

a neutral aromatic monomer comprising

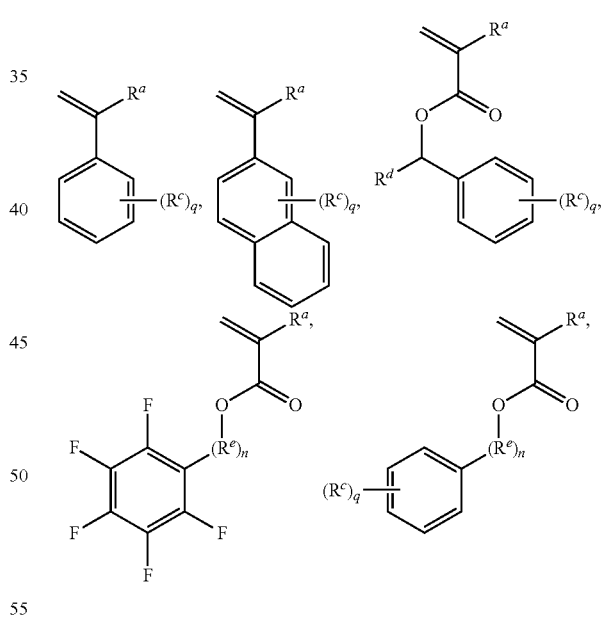

or a combination thereof, wherein $R^a$ is —H, —F, —CH$_3$, or —CF$_3$; $R^c$ is halogen, C$_{1-12}$ hydrocarbyl, C$_{1-6}$ perfluoroalkyl, C$_{3-6}$ perfluorocycloalkyl; $R^d$ is C$_{1-10}$ alkyl, C$_{3-10}$ cycloalkyl, C$_{1-6}$perfluoroalkyl, C$_{3-6}$ perfluorocycloalkyl, C$_{1-10}$ alkenyl, C$_{3-10}$ cycloalkenyl, or C$_{6-12}$ aryl; $R^e$ is C$_{1-10}$ alkylene or C$_{3-10}$ cycloalkylene; n is 0 or 1; and q is 0, 1, 2, 3, 4, or 5.

* * * * *